(12) United States Patent
Aleksov et al.

(10) Patent No.: US 10,964,178 B2
(45) Date of Patent: *Mar. 30, 2021

(54) SYSTEMS, METHODS AND APPARATUSES FOR IMPLEMENTING INCREASED HUMAN PERCEPTION OF HAPTIC FEEDBACK SYSTEMS

(71) Applicant: Intel Corporation, Santa Clara, CA (US)

(72) Inventors: Aleksandar Aleksov, Chandler, AZ (US); Georgios C. Dogiamis, Chandler, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 30 days.

This patent is subject to a terminal disclaimer.

(21) Appl. No.: 16/327,252

(22) PCT Filed: Oct. 1, 2016

(86) PCT No.: PCT/US2016/000080
§ 371 (c)(1),
(2) Date: Feb. 21, 2019

(87) PCT Pub. No.: WO2018/063136
PCT Pub. Date: Apr. 5, 2018

(65) Prior Publication Data
US 2019/0188976 A1    Jun. 20, 2019

(51) Int. Cl.
*G08B 6/00* (2006.01)
*G06F 1/16* (2006.01)
(Continued)

(52) U.S. Cl.
CPC ............... *G08B 6/00* (2013.01); *G06F 1/163* (2013.01); *G06F 1/203* (2013.01); *G06F 3/016* (2013.01);
(Continued)

(58) Field of Classification Search
CPC ... G08B 6/00; G06F 1/16; G06F 1/163; G06F 1/203; G06F 3/01; G06F 3/011;
(Continued)

(56) References Cited

U.S. PATENT DOCUMENTS 5,719,561 A     2/1998  Gonzales
2006/0244343 A1 * 11/2006 Sugahara ............... H01L 41/29
                                                              310/341
(Continued)

FOREIGN PATENT DOCUMENTS

WO    WO-2012029009    3/2012

OTHER PUBLICATIONS

International Preliminary Report on Patentability for International Patent Application No. PCT/US2016/000080 dated Apr. 11, 2019, 15 pgs.
(Continued)

*Primary Examiner* — Van T Trieu
(74) *Attorney, Agent, or Firm* — Schwabe, Williamson & Wyatt, P.C.

(57) ABSTRACT

In accordance with disclosed embodiments, there are provided systems, methods, and apparatuses for implementing increased human perception of haptic feedback systems. For instance, there is disclosed in accordance with one embodiment there is wearable device, having therein: a wearable device case; a plurality of actuators within the wearable device case, each of which to vibrate independently or in combination; one or more pins attached to each of the plurality of actuators, one end of each of the plurality of pins (Continued)

affixed to the actuators extrudes beyond surface of the wearable device case and is exposed outside of the wearable device case; electrical interconnects from each of the plurality of actuators to internal semiconductor components of the wearable device. Other related embodiments are disclosed.

26 Claims, 30 Drawing Sheets

(51) Int. Cl.
    *G06F 3/01*       (2006.01)
    *G06F 1/20*       (2006.01)
    *B23K 1/20*       (2006.01)
    *H01L 23/367*    (2006.01)
    *H01L 23/538*    (2006.01)
    *H01L 25/18*     (2006.01)

(52) U.S. Cl.
    CPC .......... *B23K 1/203* (2013.01); *H01L 23/3675* (2013.01); *H01L 23/5389* (2013.01); *H01L 25/18* (2013.01)

(58) Field of Classification Search
    CPC .......... G06F 3/016; G06F 3/017; G06F 3/018; G06F 3/02; G01C 21/3652
    See application file for complete search history.

(56) References Cited

U.S. PATENT DOCUMENTS

| | | |
|---|---|---|
| 2007/0146317 A1 | 6/2007 | Schena |
| 2009/0009301 A1 | 1/2009 | Yang et al. |
| 2010/0265176 A1* | 10/2010 | Olsson .................. G05G 9/047 345/161 |
| 2012/0068957 A1 | 3/2012 | Puskarich et al. |
| 2015/0153179 A1* | 6/2015 | Bolzmacher .......... G01C 21/20 345/173 |
| 2015/0238073 A1* | 8/2015 | Charles .................. A61B 1/04 600/102 |
| 2015/0311012 A1* | 10/2015 | Wada .................. H01L 41/1132 200/514 |
| 2015/0314195 A1* | 11/2015 | Bekri .................... A63F 13/285 463/30 |
| 2016/0299602 A1* | 10/2016 | Shuster .................. H04L 67/10 |
| 2017/0258995 A1* | 9/2017 | Hyde .................... A61B 5/4839 |
| 2018/0106636 A1* | 4/2018 | Hu ...................... G01C 21/3691 |
| 2019/0187798 A1* | 6/2019 | Dogiamis ............... G06F 1/163 |

OTHER PUBLICATIONS

International Search Report and Written Opinion for International Patent Application No. PCT/US2016/000080 dated Jul. 12, 2017, 19 pgs.

* cited by examiner

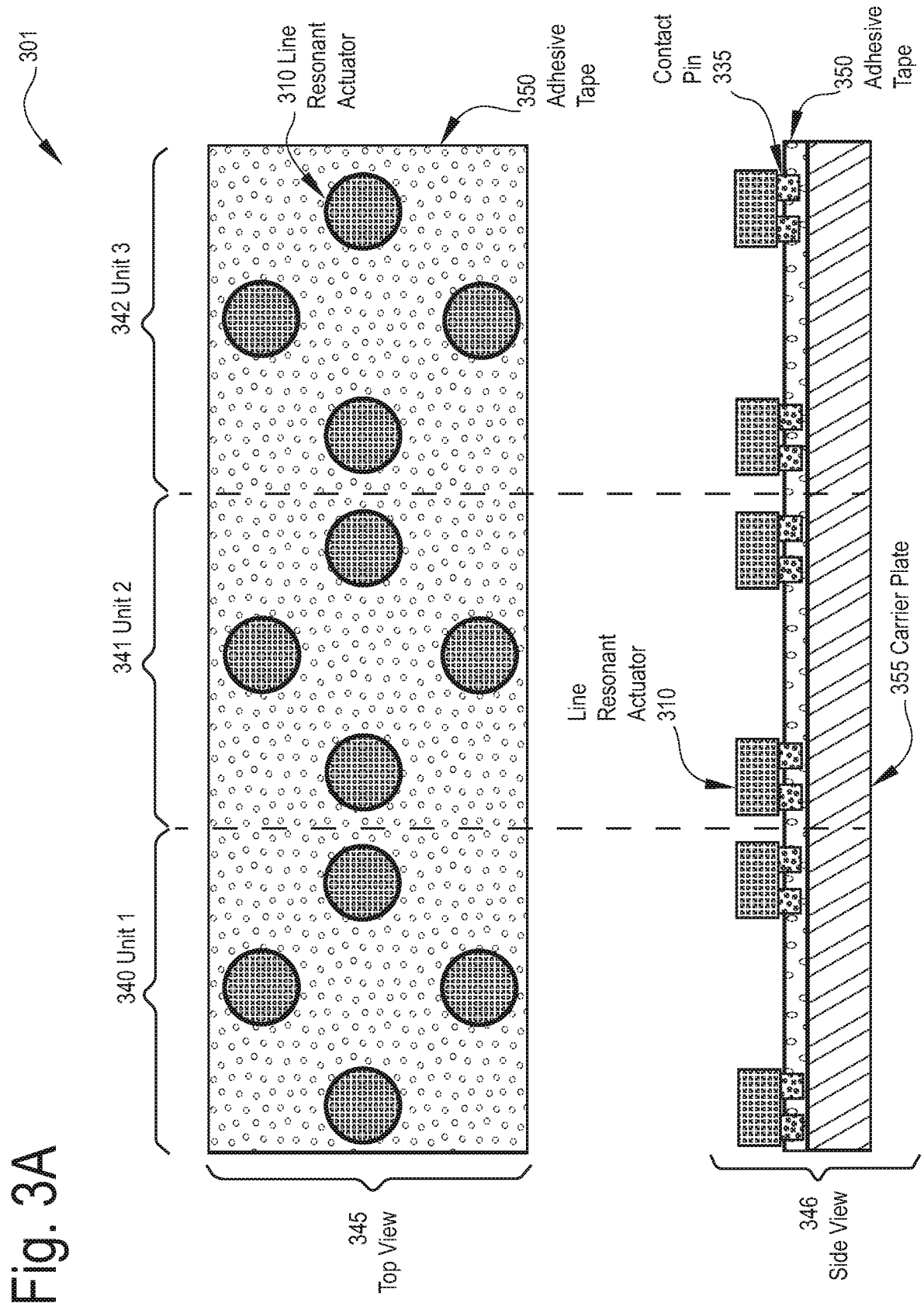

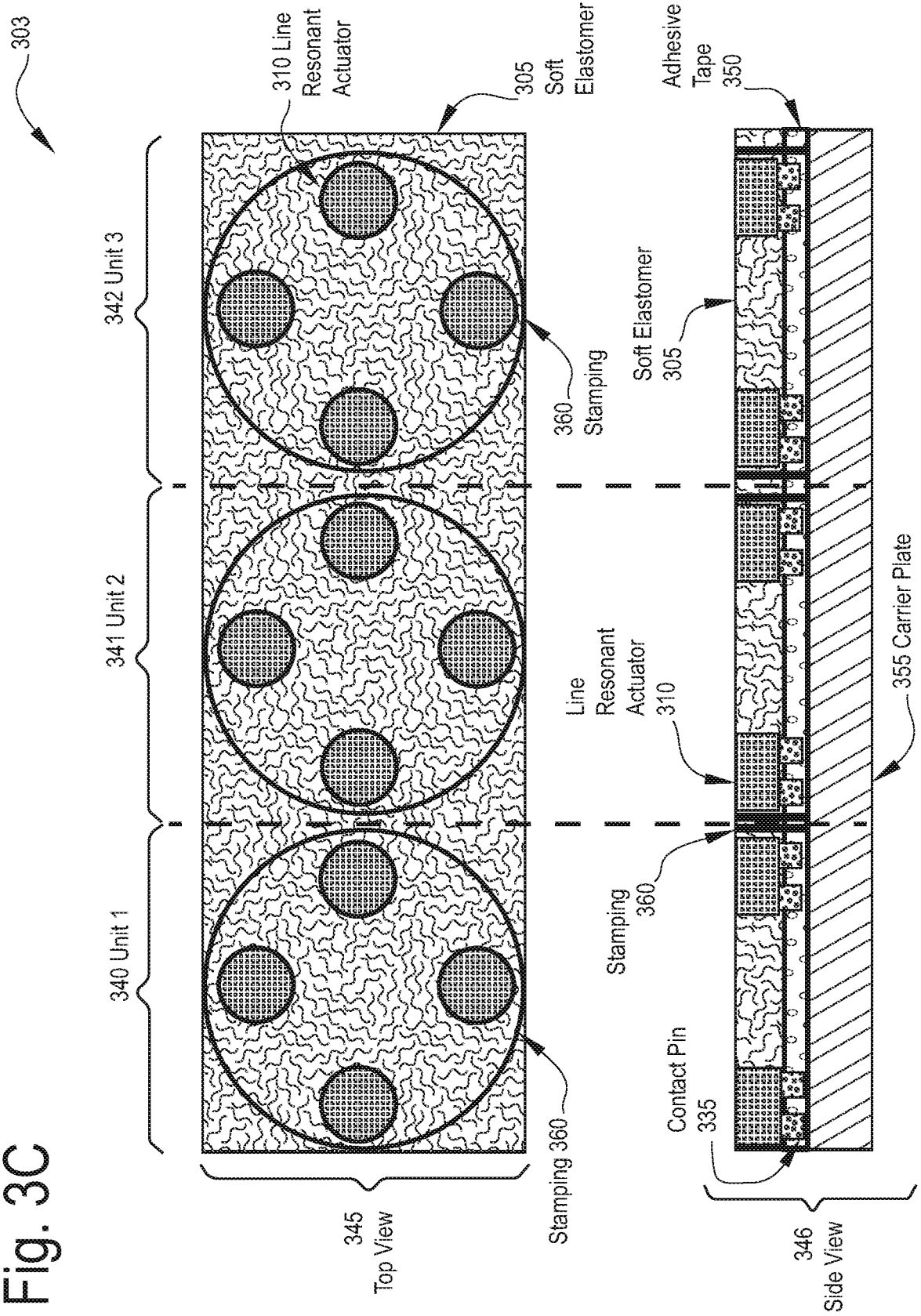

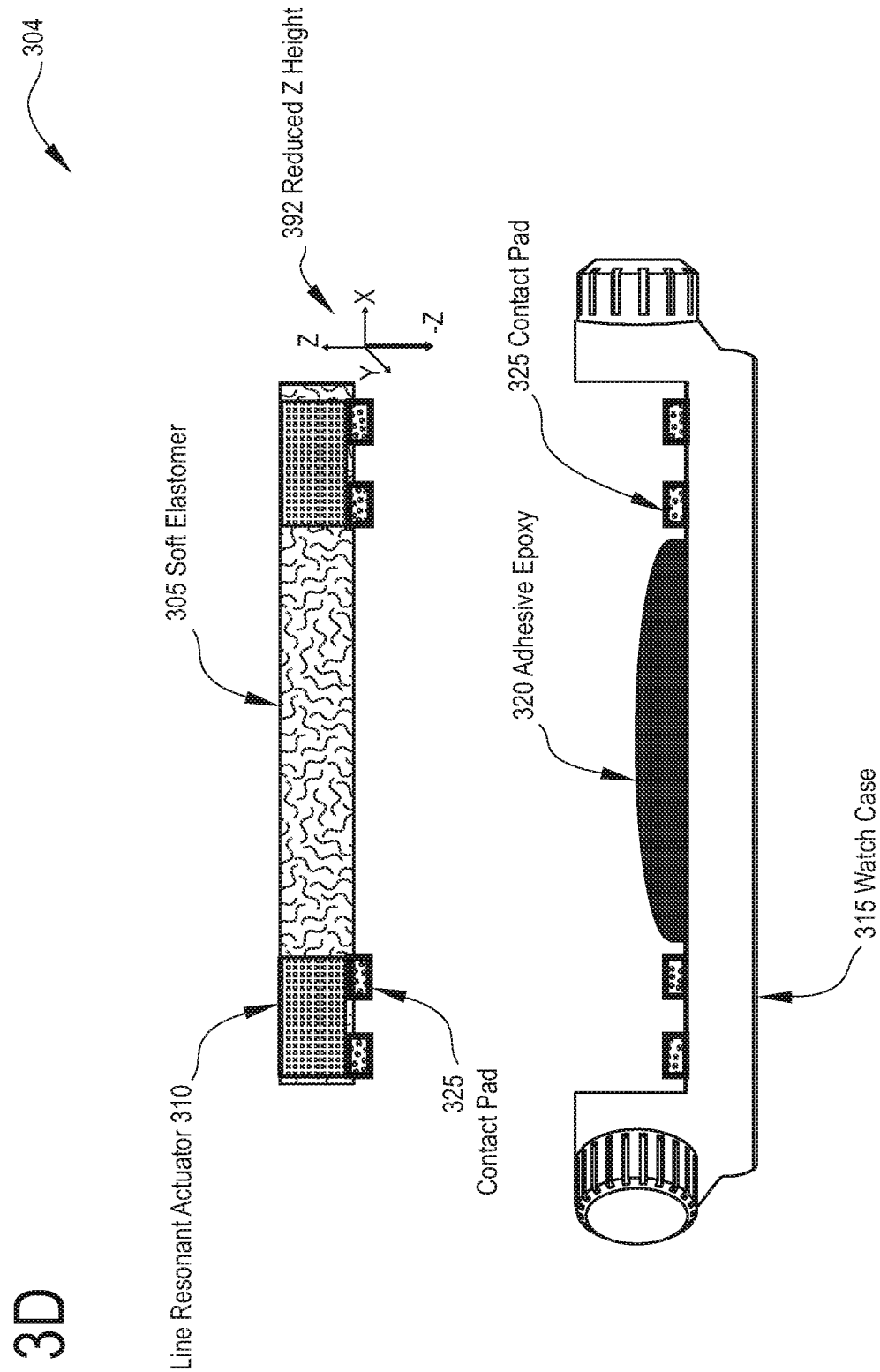

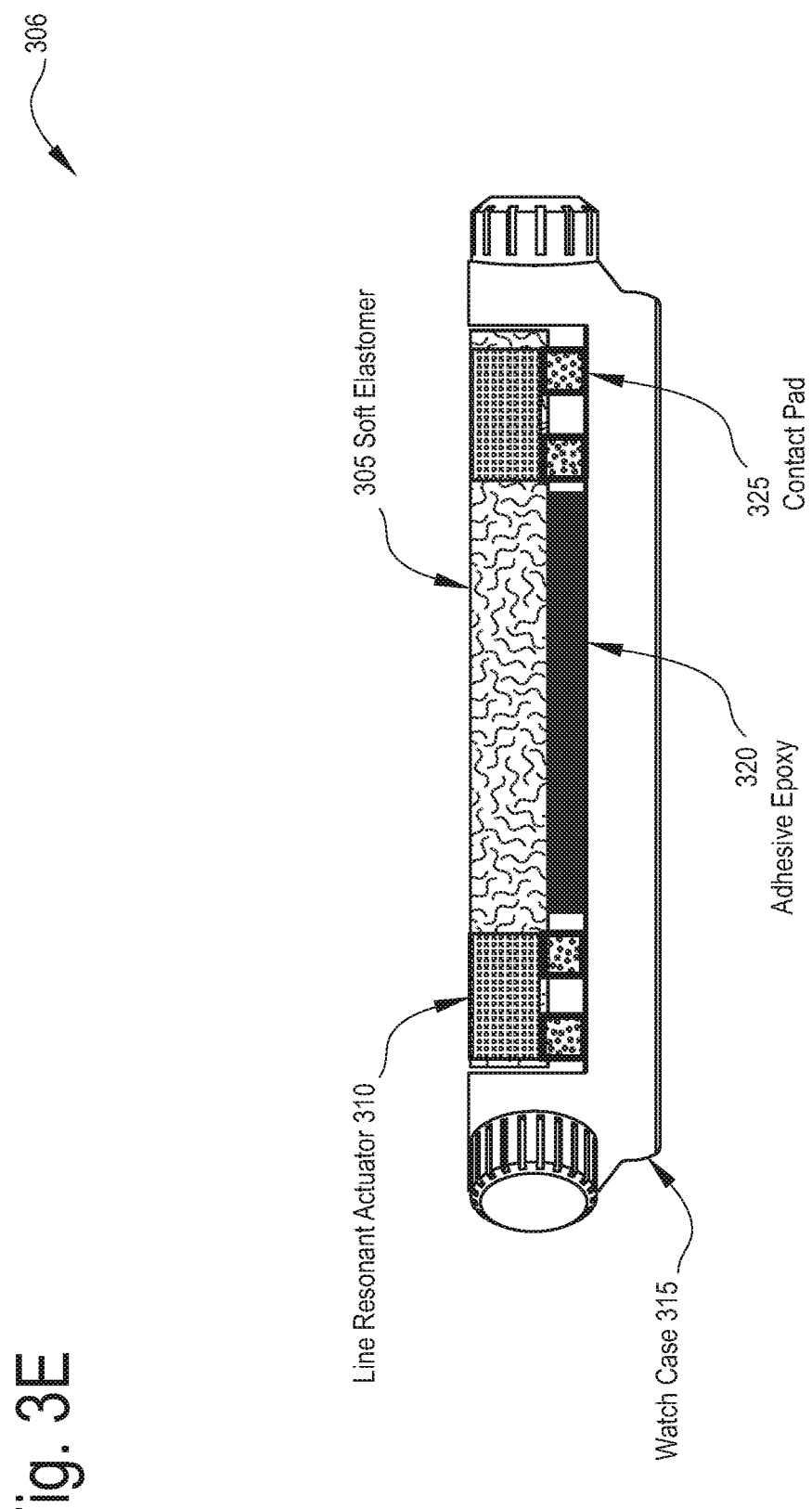

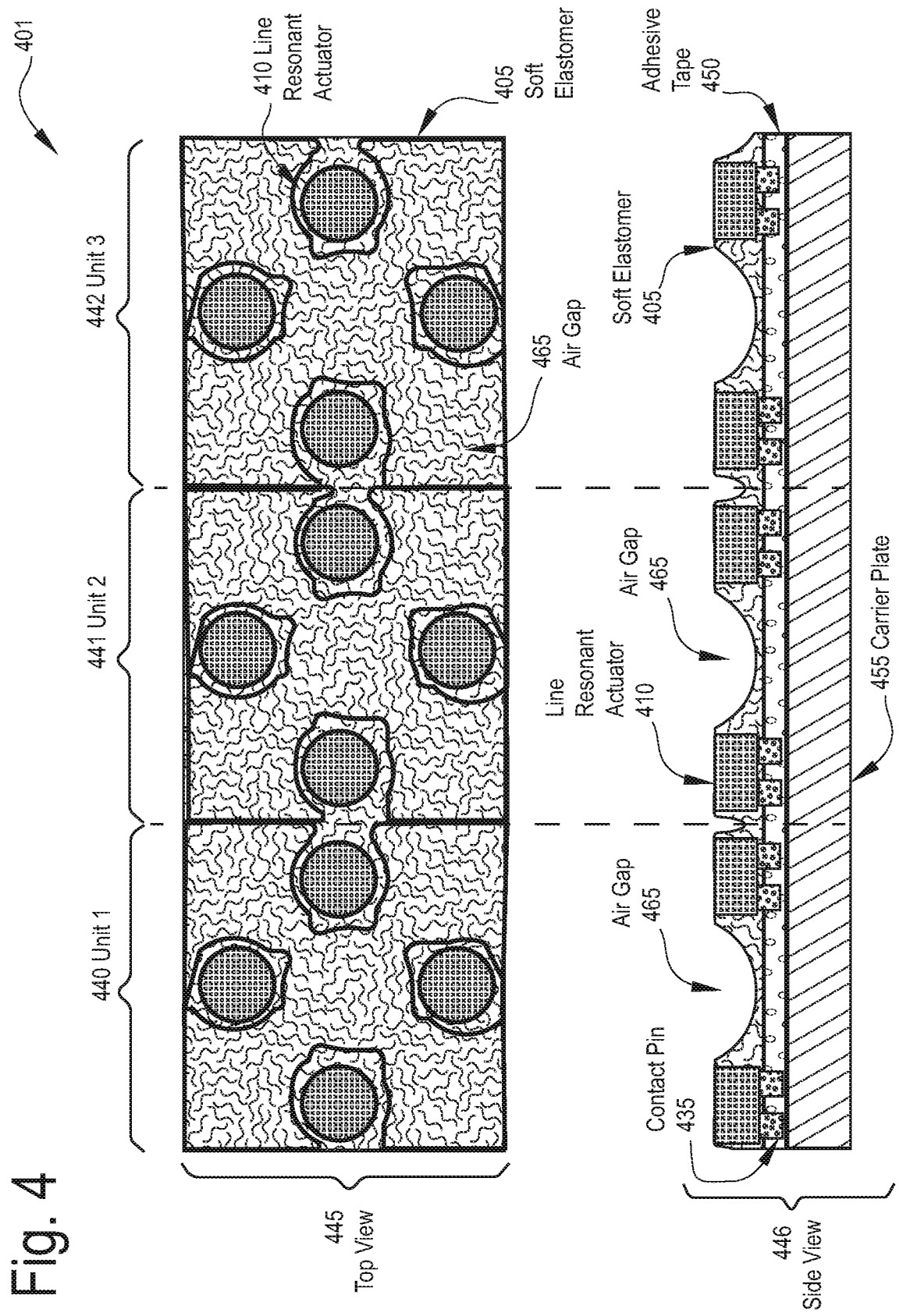

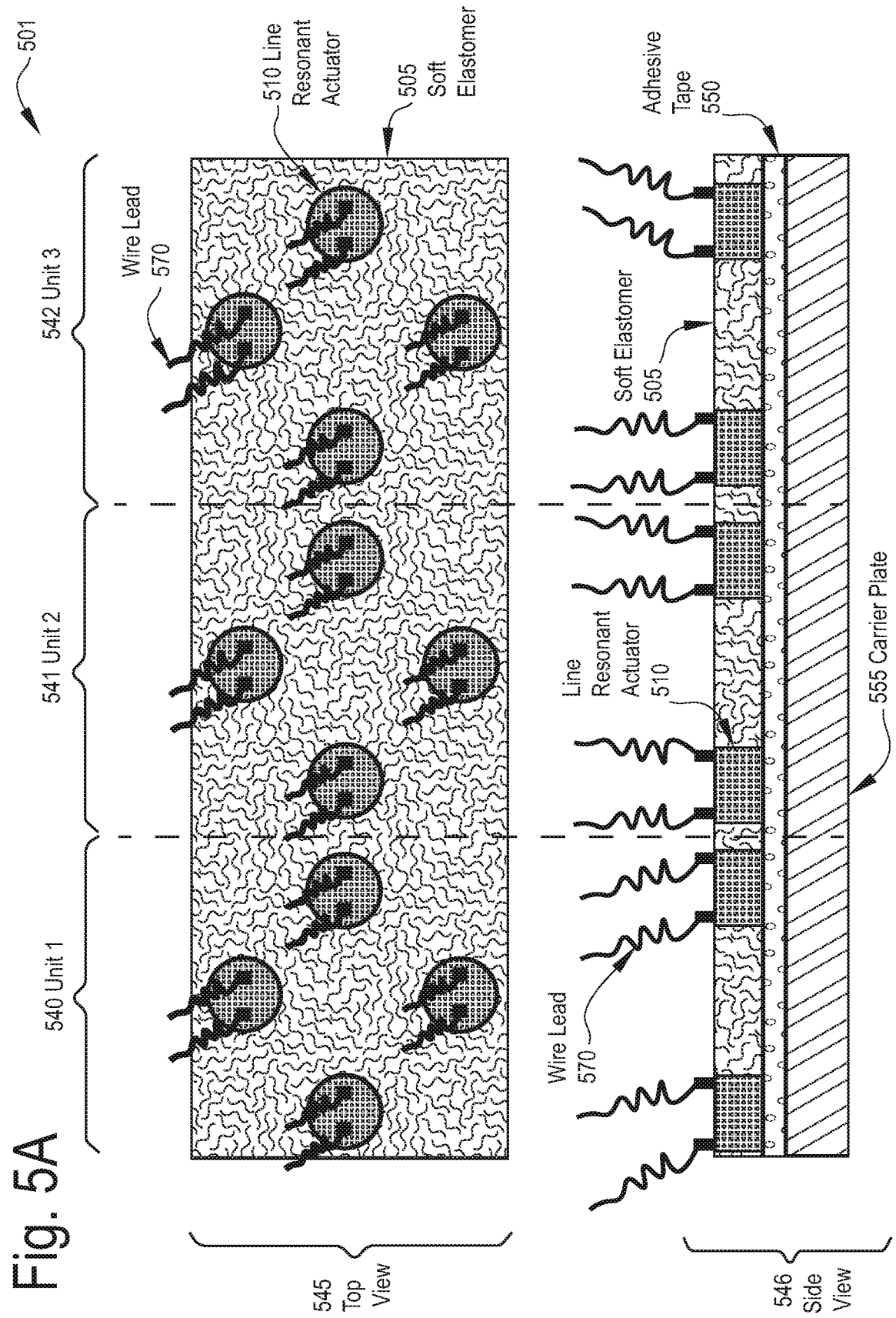

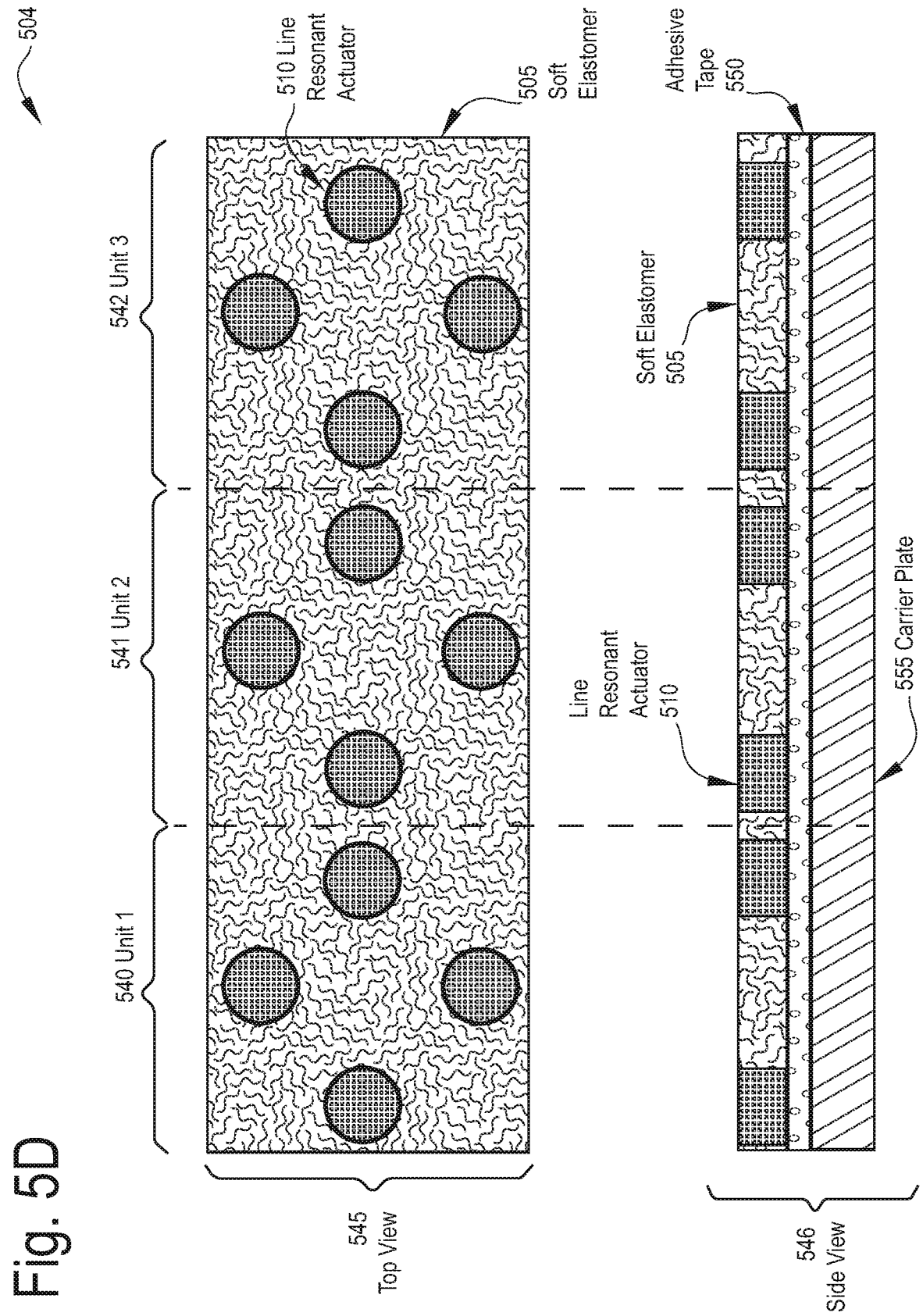

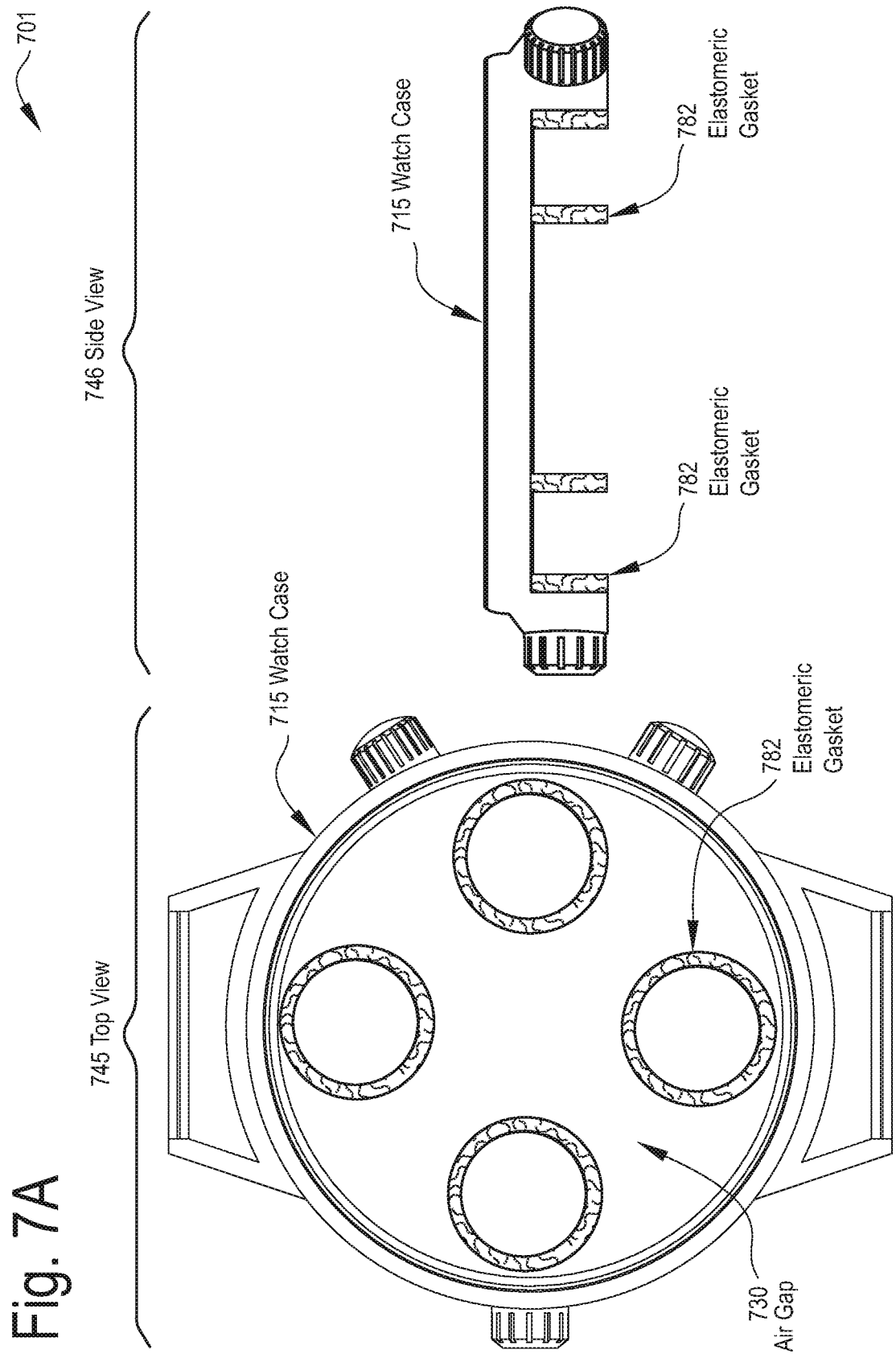

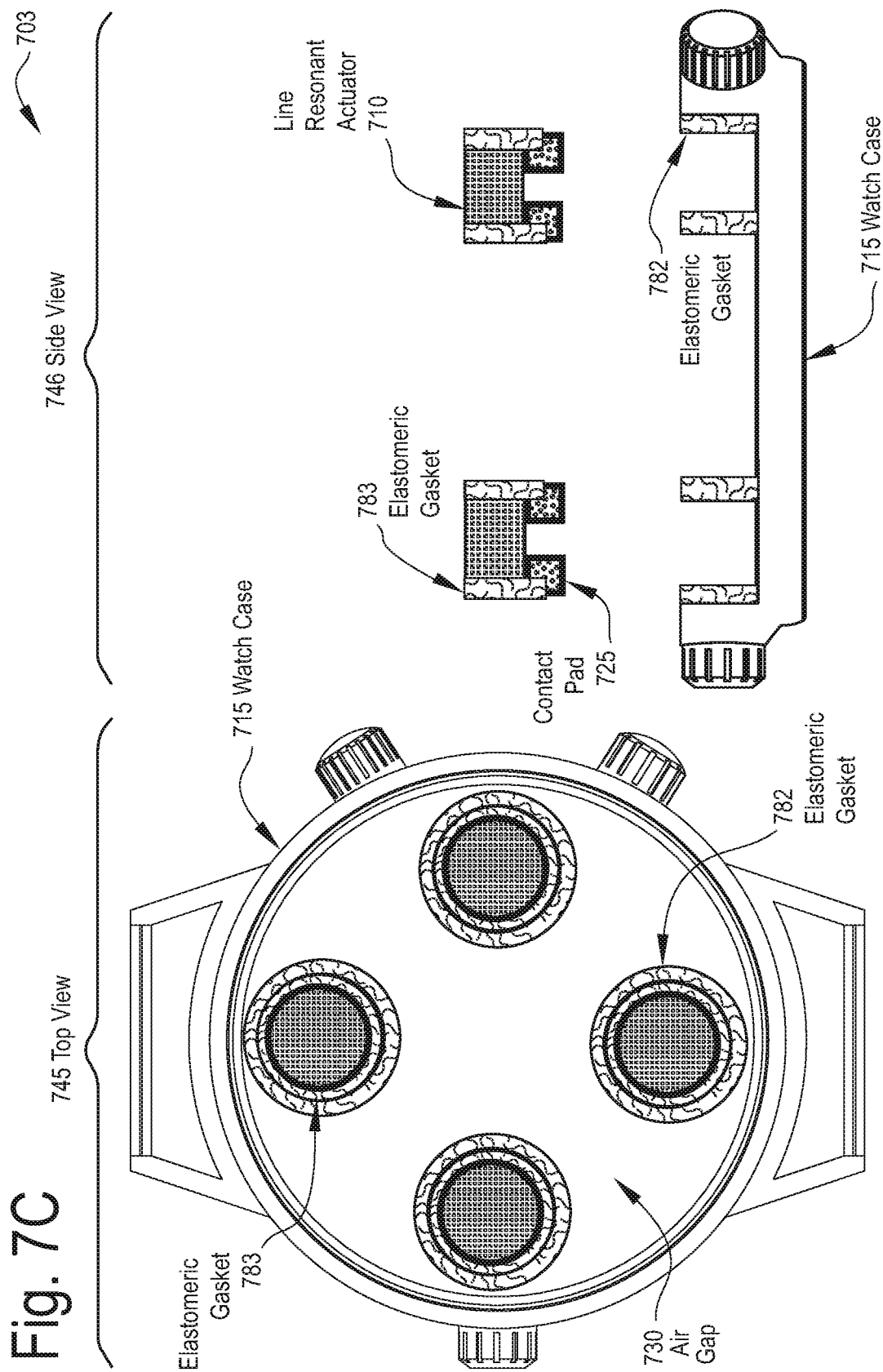

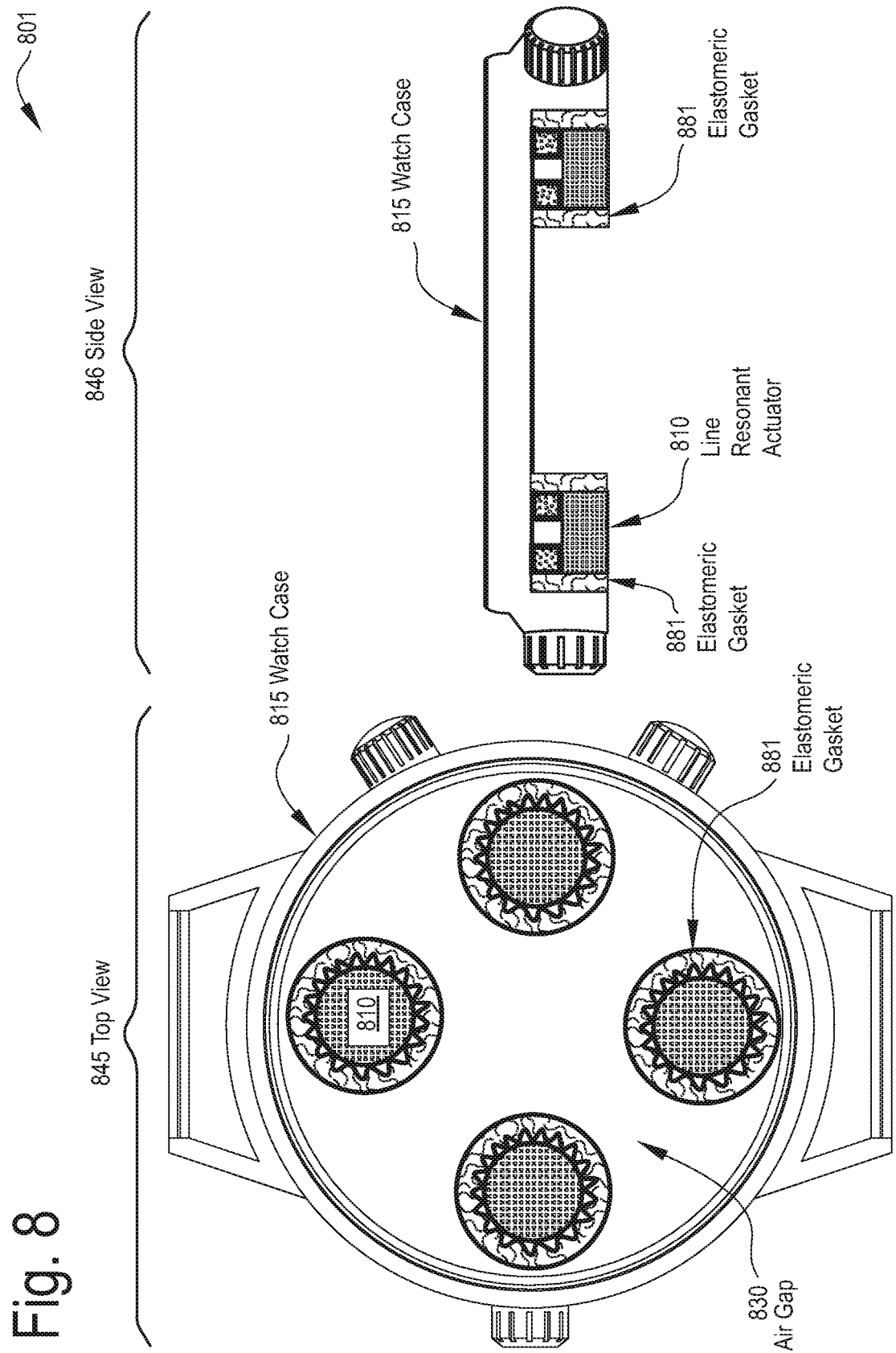

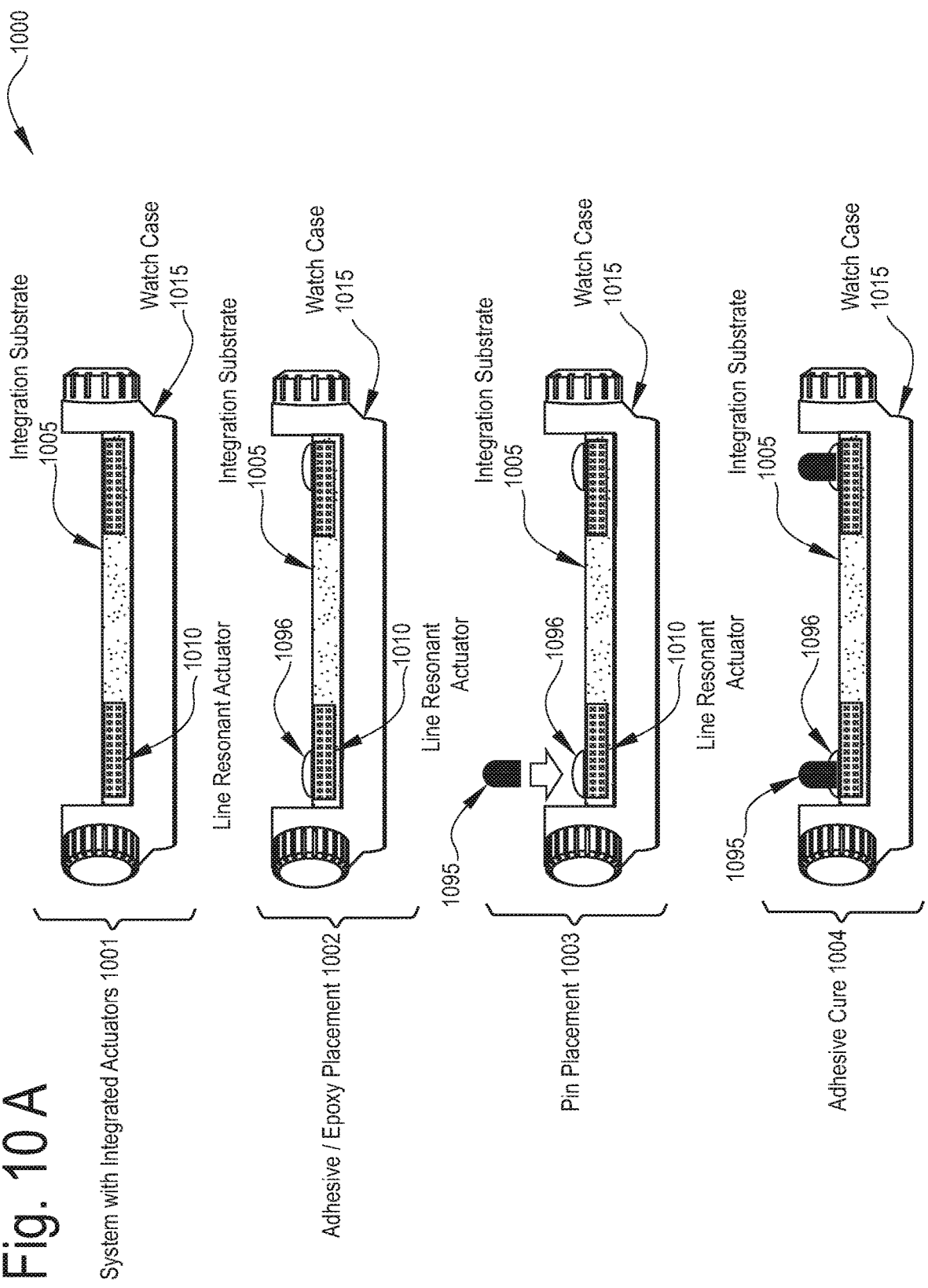

SYSTEMS, METHODS AND APPARATUSES FOR IMPLEMENTING INCREASED HUMAN PERCEPTION OF HAPTIC FEEDBACK SYSTEMS

CROSS-REFERENCE TO RELATED APPLICATION

This patent application is a U.S. National Phase Application under 35 U.S.C. § 371 of International Application No. PCT/US2016/000080, filed Oct. 1, 2016, entitled "SYSTEMS, METHODS AND APPARATUSES FOR IMPLEMENTING INCREASED HUMAN PERCEPTION OF HAPTIC FEEDBACK SYSTEMS," which designates the United States of America, the entire disclosure of which is hereby incorporated by reference in its entirety and for all purposes.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The subject matter described herein relates generally to the field of semiconductor and electronics manufacturing including wearables, and more particularly, to systems, methods, and apparatuses for implementing increased human perception of haptic feedback systems.

BACKGROUND

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also correspond to embodiments of the claimed subject matter.

As modern electronics advance, a variety of new use cases and implementations are entering the marketplace embedding various semiconductor products and consumer electronics for clothing and other wearable devices. So called "wearables," "wearable technology," "fashionable technology," "wearable devices," "tech togs," and "fashion electronics" are all in reference to a class of clothing, garments, and accessories which incorporate computer and advanced electronics technologies into "wearable" pieces, be they clothing, watches, wearable accessories, or otherwise. Wearable devices such as activity trackers represent a part of the "Internet of Things" or "IoT" as they form part of the network of physical objects or "things" embedded with electronics, software, sensors and connectivity to enable objects to exchange data with a manufacturer, operator and/or other connected devices, without requiring human intervention.

While such wearables commonly have an aesthetic aspect to them, there are additionally functional and technological aspects of wearables which raise challenges in the context of semiconductor and electronics manufacturing of such wearables.

Future electronic systems including wearable and other consumer products such as phones, tablets etc., will provide enhanced user experience by utilizing haptic or tactile feedback. Conventional haptic feedback systems vibrate an entire device responsive to user interactions by using a bulky motor. Such systems provide a single "global" haptic feedback signal to the user which is not localized at any specific location of the user's hand, wrist, body, etc.

The present state of the art may therefore benefit from the means for implementing increased human perception of haptic feedback systems as described herein.

BRIEF DESCRIPTION OF THE DRAWINGS

Embodiments are illustrated by way of example, and not by way of limitation, and will be more fully understood with reference to the following detailed description when considered in connection with the figures in which:

DETAILED DESCRIPTION

Figure 1A:
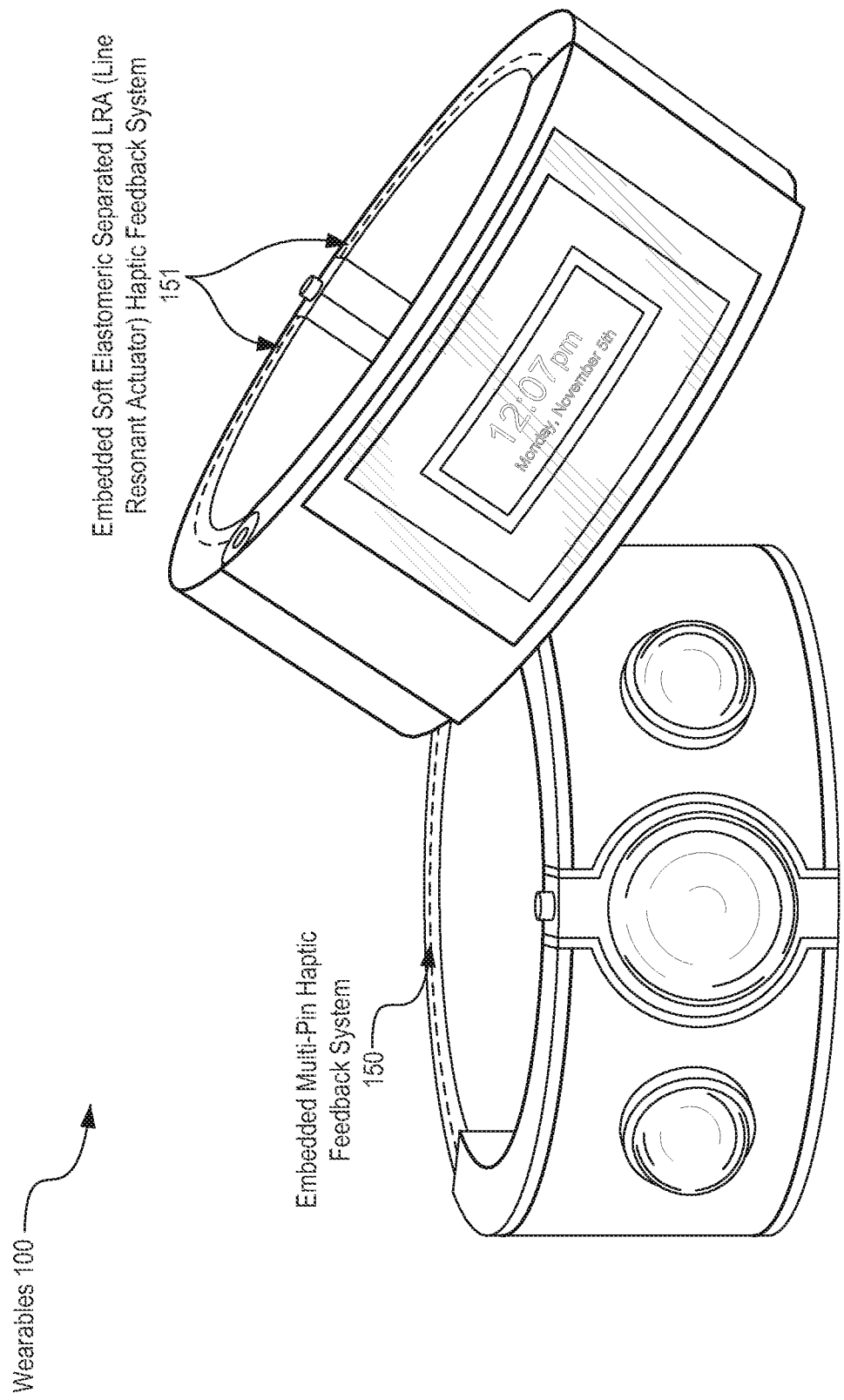

Described herein are systems, methods, and apparatuses for implementing increased human perception of haptic feedback systems. For instance, according to one embodiment there is wearable device, having therein: a wearable device case; a plurality of actuators within the wearable device case, each of which to vibrate independently or in combination; one or more pins attached to each of the plurality of actuators, one end of each of the plurality of pins affixed to the actuators extrudes beyond surface of the wearable device case and is exposed outside of the wearable device case; electrical interconnects from each of the plurality of actuators to internal semiconductor components of the wearable device.

In the following description, numerous specific details are set forth such as examples of specific systems, languages, components, etc., in order to provide a thorough understanding of the various embodiments. It will be apparent, however, to one skilled in the art that these specific details need not be employed to practice the embodiments disclosed herein. In other instances, well known materials or methods have not been described in detail in order to avoid unnecessarily obscuring the disclosed embodiments.

In addition to various hardware components depicted in the figures and described herein, embodiments further include various operations which are described below. The operations described in accordance with such embodiments may be performed by hardware components or may be embodied in machine-executable instructions, which may be used to cause a general-purpose or special-purpose processor programmed with the instructions to perform the operations. Alternatively, the operations may be performed by a combination of hardware and software.

Any of the disclosed embodiments may be used alone or together with one another in any combination. Although various embodiments may have been partially motivated by deficiencies with conventional techniques and approaches, some of which are described or alluded to within the specification, the embodiments need not necessarily address or solve any of these deficiencies, but rather, may address only some of the deficiencies, address none of the deficiencies, or be directed toward different deficiencies and problems which are not directly discussed.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1A depicts exemplary wearables 100 in accordance with which embodiments may operate.

More particularly, the wearable 100 product on the left has embedded therein a multi-pin haptic feedback system 150 and the wearable 100 on the right has embedded therein a soft elastomeric separated LRA (Line Resonant Actuator) haptic feedback system 151.

Such wearables 100 may additionally incorporate advanced wearable semiconductor electronics manufacturing techniques such as utilizing thin, flexible, and/or bendable substrates, etc.

Such technologies provide tightly assembled electronic packages for both static electronics but which require electrical connections in 3 axes, thus making the flexibility of the electronics advantageous for both manufacturing and assembly of such products, as well as dynamic electronics applications such movable electronics for which the electronics and electrical connections are required to flex and/or stretch during manufacture, assembly, as well as during their intended use by consumers.

In embodiments there are provided wearable technologies to be worn as a clothing item or an accessory, in which the wearable technologies include haptic feedback systems which improve human perception of the haptic signals, including providing for localized (e.g., non-global) human perceptible haptic signals from such wearables 100.

In accordance with such an embodiment, the wearable technology is embodied within one of: a clothing item; sports attire; a shoe; fashion electronics to be worn as a clothing item or an accessory; tech togs to be worn as a clothing item or an accessory; fashionable technology to be worn as a clothing item or an accessory; or a flexible wearable technology to be worn as a clothing item or an accessory.

Figure 1B:
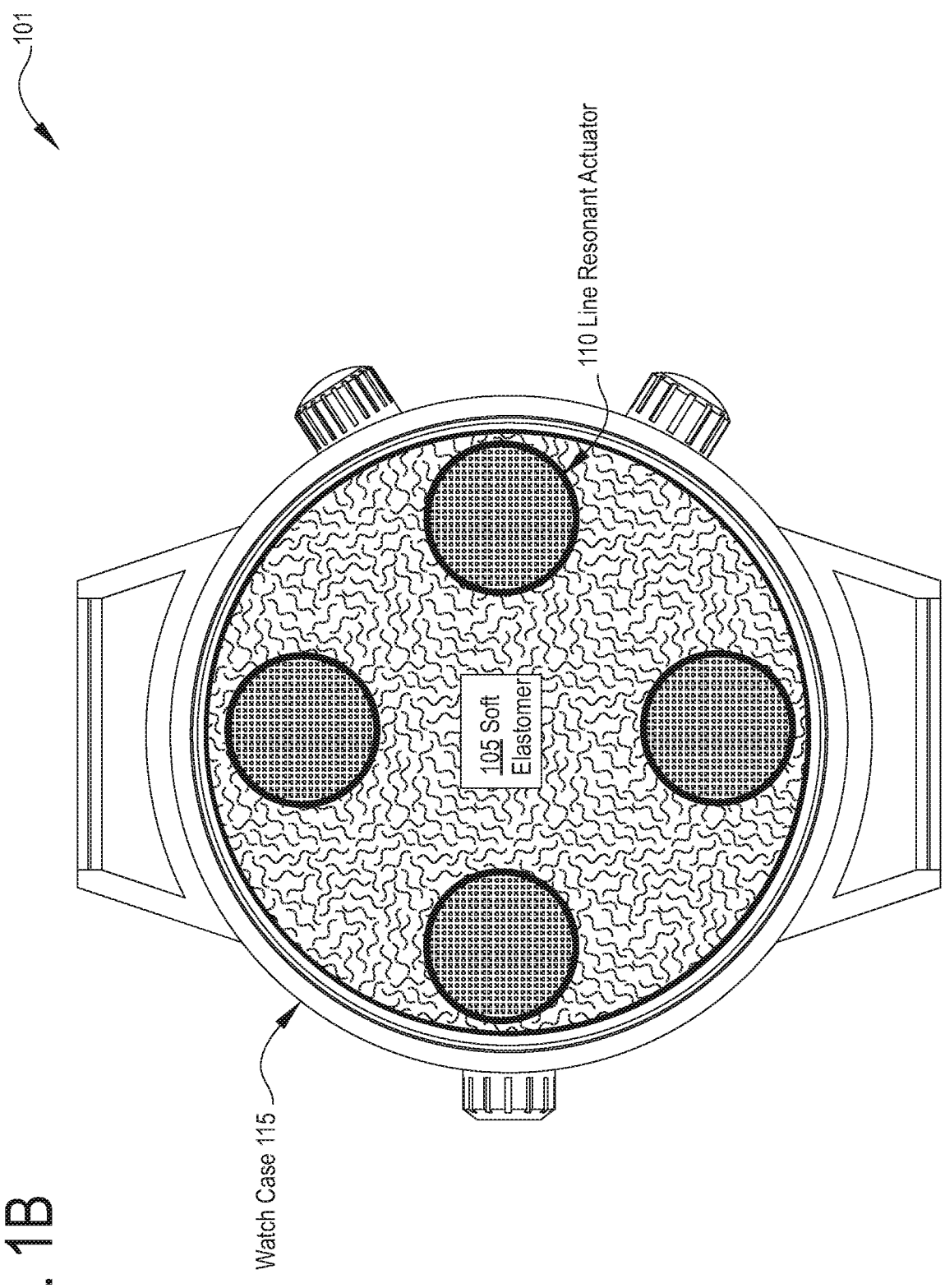

FIG. 1B depicts an exemplary wearable 101 in accordance with which embodiments may operate.

In particular, there is depicted here a watch case 115 having multiple Line Resonant Actuators (LRAs) 110 embedded therein, each spaced out within the wearable case (watch case 115) so as to provide localized/non-global human perceptible haptic feedback system signals from the wearable responsive to user interactions.

Notably, the line resonant actuators 110 are all separated upon a horizontal plane by a soft elastomer which dampens or reduces vibration of the entire device and thus maximizes the haptic feedback signal to a user of the wearable at each of the four distinctly depicted LRA 110 locations.

As depicted, multiple haptic actuators, depicted here as the line resonant actuators 110, are embodied within a soft elastic layer formed by a soft elastomer 105. By doing so, the localized vibrations emanating from each of the respective LRAs 110 onto the user's skin allows for each actuation location corresponding to the four depicted LRAs 110 to be felt or perceived by a human user as a distinct point or discerned as a distinct and localized haptic feedback signal.

Specifically shown here is the backside of a wearable watch case 115 with the four actuators embedded therein, each of which are to come in contact with the user's wrist when worn by a human user.

In order for the four LRA 110 actuators to be felt as discrete points or discrete vibrations rather than simply a global vibration on the wrist independent of actuator location, there are two requirements which must be met. First, the actuator pitch should be equal to or greater than the two point discrimination threshold of the user's wrist. Secondly, each of the four actuators must be at least partially mechanically decoupled both from the system enclosure, here the watch case 115 as well as from each other.

Because the two point discrimination threshold at the wrist of a human user varies from 25-35 mm according to recent research, it is both necessary to provide sufficient separation amongst each of the individual actuators if the first point is to be met, and it is additionally necessary to mechanically decouple the actuators so that vibrations are not simply aggregated and perceived as a single global haptic feedback signal by the human user.

Conventionally provided haptic feedback systems for consumer electronics, be they wearables such as the watch wearable 101 depicted here or other consumer electronics such as smartphones, tablets, etc., utilize global or singular haptic feedback systems in which the haptic signal associates to the entirety of the device by vibrating the entire rigid device and is not locally perceptible and any area or sub-portion of such a device.

Consider for instance a smartphone or tablet having such a global haptic feedback system there. The haptic feedback signal is perceptible by a human user's hand, but such a user cannot discern from where within the device the haptic signal originated. Indeed, by design, the signal cannot be localized as it is generated via a single bulky vibration device.

Similarly, with respect to smartwatches, a human user may perceive a haptic feedback signal upon their wrist or other body location for other wearables, however, that haptic feedback signal is singular or global for the wearable device. There is no way for the user to discern any localized signal source as there is no localized signal source.

Conversely, as may be observed here, there are multiple such LRAs 110 within the single watch case 115 through which to individually generate localized haptic feedback signals to the user.

Such next generation haptics as described herein therefore focus on the creation of localized "tactors" using, by way of example, millimeter or even micrometer scale haptic actuators that provide independent localized actuation to the user's skin to produce localized (non-global) haptic feedback signals to the user which are discernable by the user to specific localized areas of the wearable device, such as left side, right side, top side, bottom, etc.

Through the user of such tactors or localized haptic feedback signals, such a user may therefore, be notified at different hand or wrist locations according to a preset classification of notifications depending on priority, sender, application, etc. Stated differently, the varying localized inputs may be utilized to provide varying notifications rather than simply having a global haptic feedback signal which provides a notification, but cannot be made to provide localized notifications having differing meanings to the user.

Still further, through the user of localized tactors and actuators, it is additionally possible to perform electronic transfer of texture to the user. For instance, in other engineering domains, the localized haptic feedback systems may be integrated into a feedback textile suit, a haptic belt, driver's seat, virtual reality goggles, a driving wheel, a joystick, integrated into various textiles, fabrics, and clothing, or integrated within a printed circuit board (PCB) of a larger electronic system such as a keyboard, mouse, stylus, and so forth.

Although described embodiments are depicted in the context of wearables and other mobile consumer electronics such as smartwatches, smartphones, etc., embodiments are not so limited and may be applied to a very wide array of electronic systems where a localized non-global haptic feedback system is desirable.

Problematically, in the context of consumer wearables, skin actuation needs to possess certain characteristics in order to be perceivable by humans. Both the frequency of actuation as well as penetration depth (or skin displacement) play a significant role.

For example, human perception thresholds at the fingertips are especially sensitive and perceptive, in which actuation is human perceptible at 0-200 Hz and at displacement depths of 10-200 μm. It has been observed that there is also an inversely proportional relationship between vibration frequency and skin displacement, such that the higher the vibration frequency, the smaller the required skin displacement for the vibration to be perceived by a human user.

Notably, however, different body locations exhibit different perception thresholds.

Still further, another critical characteristic of localized (non-global) haptic feedback perception is the two-point discrimination threshold, which is the index of the smallest human perceivable spatial resolution which is approximately 2 mm at the fingertips for mechanical simulations yet fall into the range of 35-38 mm at the wrist if consumer electronics are to accommodate the widest population of users. For instance, though some users may perceive in the 25-30 mm range at the wrist, many others do not, and thus, maximizing the separation between the actuators will accommodate a greatest percentage of potential users.

It is therefore described herein means by which to increase a human user's perception of vibrations associated with localized haptic feedback system using such tactors by modifying the surface makes physical contact with the user's skin. The tactors (e.g., very small vibrating means) described herein may operate using any of the known actuation principles, such as electroactive polymers, electromagnetic, piezoelectric, hybrid, and so forth.

Described methodologies thus provide for the integration of multiple such tactors which thus permits enables an increase of human perception of the vibration emanating from such tactors.

Figure 1C:
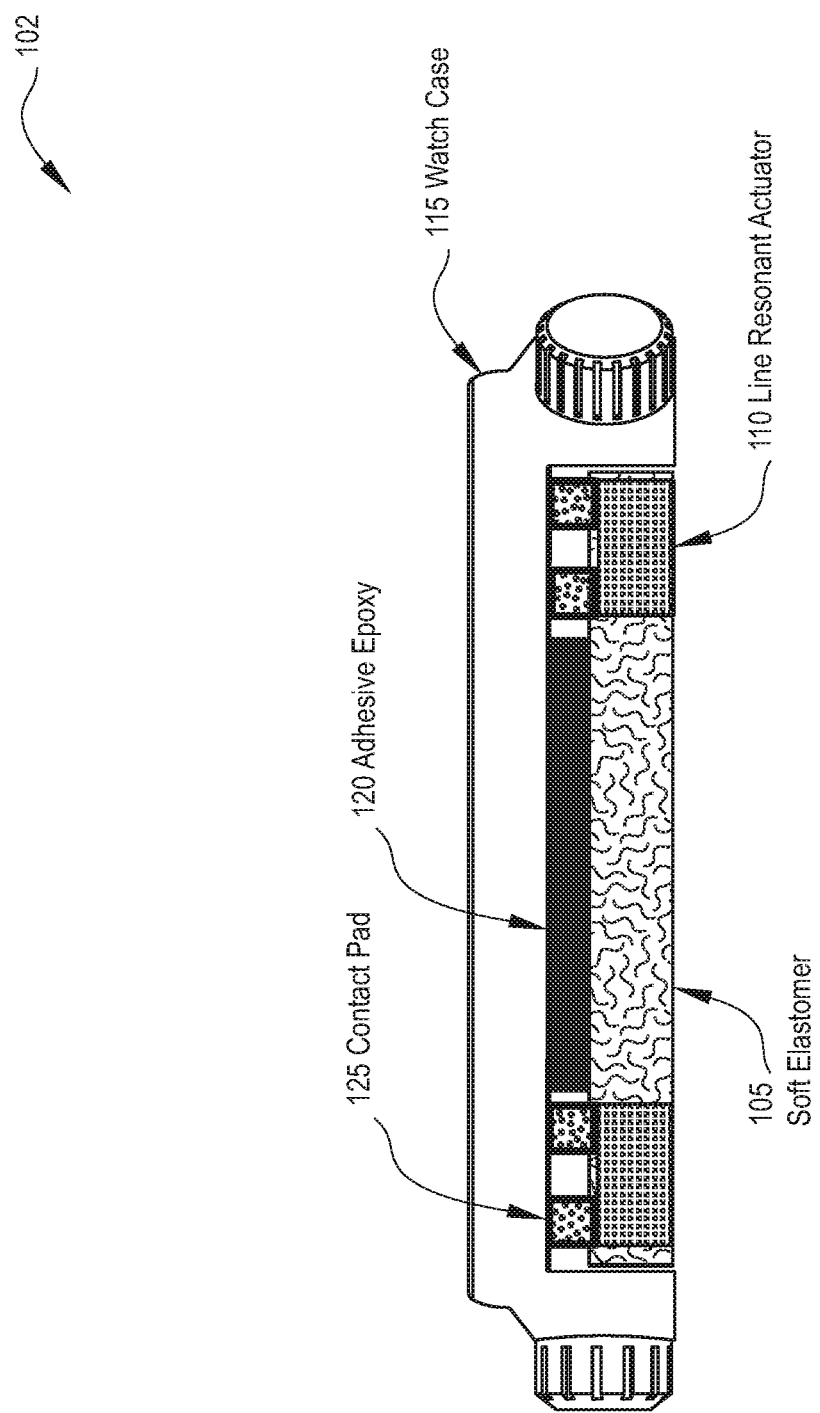

FIG. 1C depicts a side view of an exemplary wearable 102 in accordance with which embodiments may operate.

In particular, depicted here are the watch case 115, the soft elastomer 105 separating the two observable line resonant actuators 110, as well as contact pads 125 between the actuators and the watch case 115 and adhesive epoxy 120 affixing the internal assembly to the rigid watch case 115. Each contact pad provides for both a mechanical and also an electrical contact via, for example, a conductive epoxy (distinct from the adhesive epoxy 120 which is a non-conducting epoxy used here for affixing the substrate assembly to the watch case 115). Use of the conductive epoxy to connect the contact pads 125 with the actuators 110 facilitates connection of the actuator's 110 electrical leads to electrical contacts integrated within the rest of the depicted smartwatch system. The watch case has electrical contact pads to receive the electrical leads from the actuators having a continuous electrical path from the electrical leads of the actuators through the contact pads and conductive epoxy, depicted in greater detail below.

There are several ways to mechanically decouple the actuator from the rest of the system; however, many approaches are not feasible within a High Volume Manufacturing (HVM) or scalable to industrial manufacturing. It is therefore necessary to not only meet the requirements of separation for the purposes of achieving requisite two-point discrimination thresholds for any given product, but it is also necessary to allow for the formation of all necessary interconnects and electrical connectivity required to actually build and produce a reliable and functional product.

Therefore, depicted here is the integration of contact pads 125 between the bottom of the watch case 115 where the line resonant actuators 110 are exposed to the human user's skin and the interior of the rigid watch case 115, thus providing for the necessary electrical interconnect to a PCB or other semiconductor package or substrate. Moreover, by integrating the actuators 110 directly into a soft elastomer 105 as depicted here and then utilizing conductive and non-conductive epoxies 120 to facilitate the electrical and mechanical contact with the rest of the system, there is provided the rigidity and adhesion properties where required, conductive or insulating properties where required, and the mechanical decoupling properties via the soft elastomer 105 where required, for instance, through an elastomeric substrate such as PDMS, which will serve to dampen the vibration response laterally (e.g., upon the horizontal plane depicted here) within the watch case 115 or other integrating system. In such a way, the soft elastomer 105 provides both a substrate surface for the electronics and additionally provides the mechanical decoupling or vibration dampening properties desired.

The soft and flexible elastomeric substrate such as PDMS described above is in reference to flexible and flexible-stretchable materials which may be utilized in electronics including for substrate materials thus providing, for example, a stretchable dielectric material (e.g., a stretchable material which acts as an electrical insulator and can be polarized by an applied electric field), a compliant (e.g., bendable, flexible) dielectric material, a stretchable and bendable dielectric material, etc. Such materials may be formed from polyimide substrates, PEEK substrates (e.g., PolyEther Ether Ketone, a colorless organic thermoplastic polymer), PDMS substrates as noted above (e.g., PolyDiMethylSiloxane and also called dimethicone, one of a group of polymeric organosilicon compounds), silicon-based organic polymer substrates, transparent conductive polyester films and substrates, stretchable polydimethylsiloxane (PDMS) substrates, stretchable Polyisoprene substrates, stretchable polybutadiene substrates, stretchable polyisobutylene substrates, stretchable polyurethanes substrates, stretchable thermoplasticpolyurethanes substrates, stretchable butyl rubber substrates, stretchable nitrile rubber substrates, stretchable woven fabric substrates, and screen printed silver circuits on polyester substrate materials. Reference to the soft elastomer as described herein may be any of these such materials which meet the design objectives of the product.

Figure 2A:
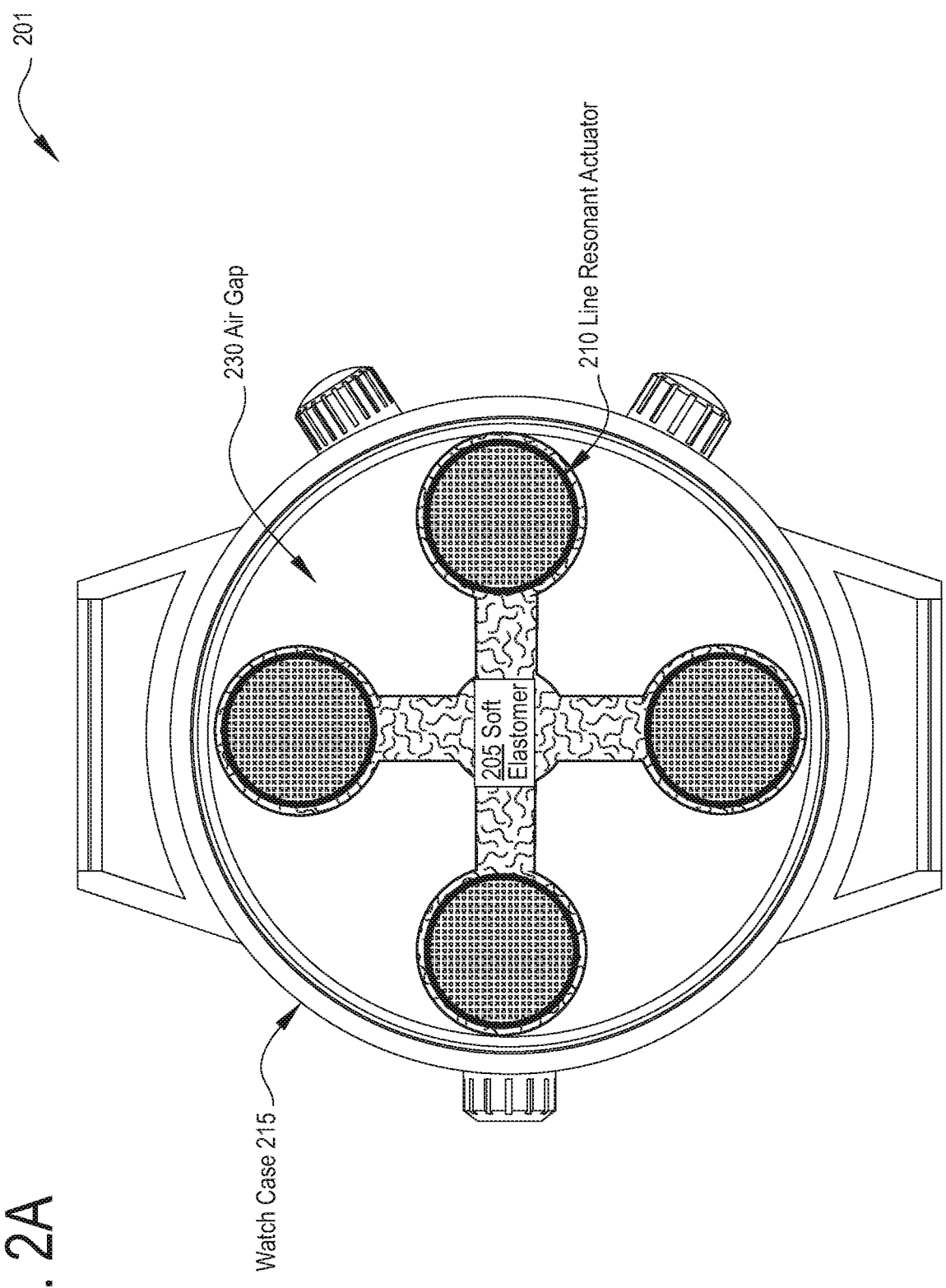

FIG. 2A depicts another exemplary wearable 201 in accordance with which embodiments may operate.

In particular, the watch case 215 depicted here again has the four line resonant actuators 210 embedded therein, each of which are surrounded by a soft elastomer 205 to dampen vibration laterally and provide at least partial mechanical decoupling, however, the area of the soft elastomer 205 between the actuators 210 has been patterned to form an air gap 230 as depicted.

In such a way, patterning some of the more compliant structures on the substrate of the device formed from the soft elastomer 205 will contributed to increased mechanical decoupling between the actuators 210 providing greater localization of the individual haptic feedback signals emanating from each of the respective actuators while permitting the actuators to remain fixedly attached within the watch case 215 as they remain embedded within the substrate formed from the soft elastomer 205.

Figure 2B:
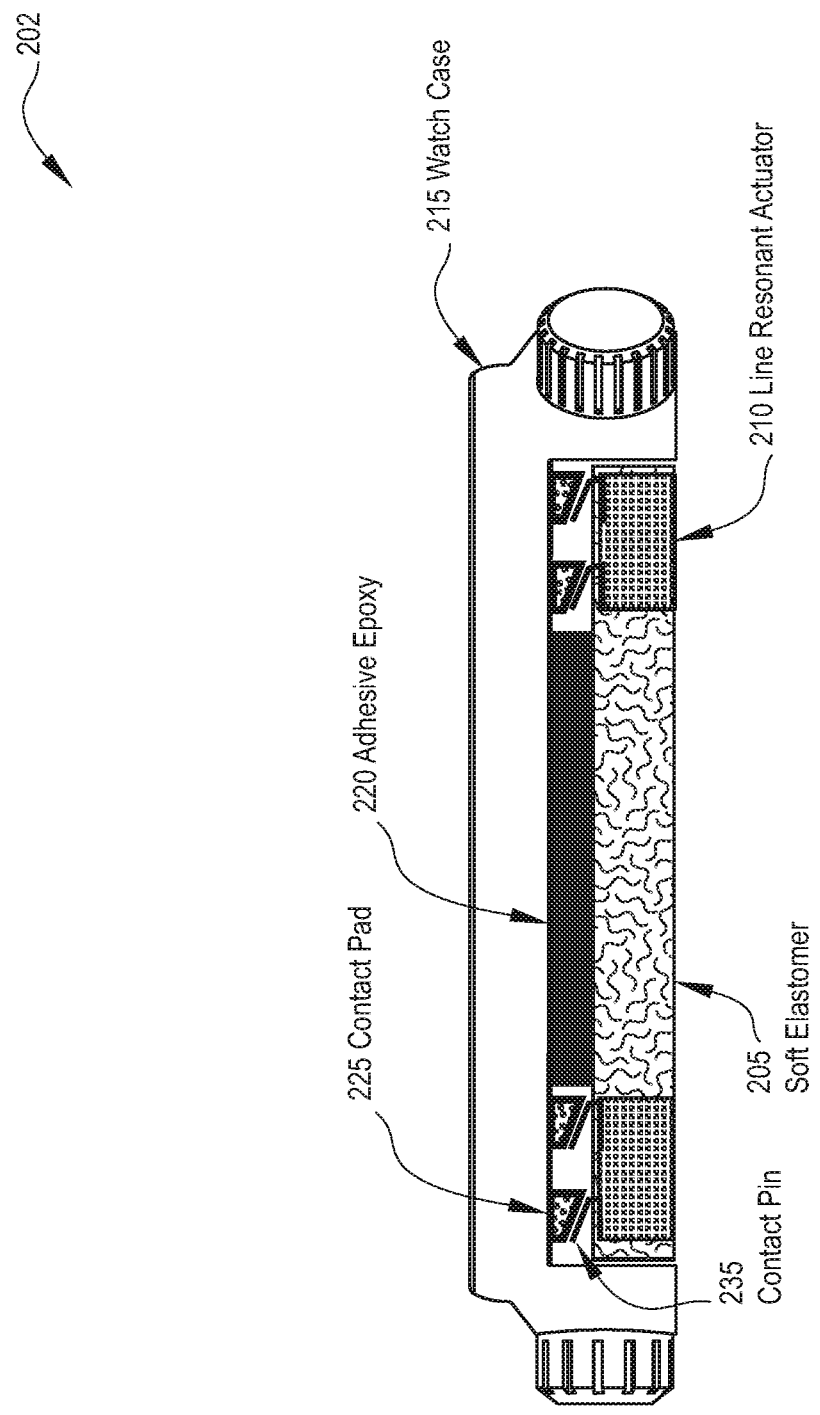

FIG. 2B depicts a side view of another exemplary wearable 202 in accordance with which embodiments may operate.

In an alternative embodiment, the actuators 210 may utilize compliant vertical contact pins 235 pins to connect to the substrate of the watch case 215 as shown here. The compliant (e.g., bendable or flexible) contact pins 235 make contact with the contact pads 225 as shown while the non-conductive adhesive epoxy 220 fixedly attaches the entire assembly to the interior of the watch case 215.

Such an embodiment may likewise benefit from the patterned elastomeric substrate for increased vibration dampening to neighboring actuators as illustrated previously.

FIG. 3A depicts a top view 345 and a side view 346 of an exemplary wearable 301 in the process of manufacture in accordance with which embodiments may operate.

There exist a variety of means by which to manufacture the wearable and other electronic devices having the localized (non-global) haptic feedback systems using multiple such actuators or tactors. For instance, one approach of manufacture is to first fabricate the elastomer mold with the line resonant actuators 310 and then attach the actuators 310 to the system substrate, such as a watch case, smartphone, PCB, semiconductor package, or other wearable, etc.

As depicted here there are three units under manufacture, units 1, 2, and 3 at elements 340, 341, and 342, which are the same units as depicted in both the top view 345 and side view 346 simply for illustrative purposes. The operations are the same in both views.

Nonetheless, as can be seen here, there is a carrier plate 355 upon which an adhesive tape 350 is applied. With the adhesive tape 350 in place, the individual line resonant actuators 310 and contact pins 335 may then be applied upside down to the adhesive tape assuming the actuators and pins are pre-assembled which is typical for an off the shelf actuator to be integrated into such a system. Otherwise, the contact pins 335 may be attached to the adhesive tape 350 and then the actuators 310 affixed to the contact pins 335 to attain the same result. Notably, the top view 345 reveals the surfaces of the line resonant actuators 310 which are upside down and will ultimately make contact with a human user's skin from the bottom of the smartwatch device being manufactured via this process.

Figure 3B:
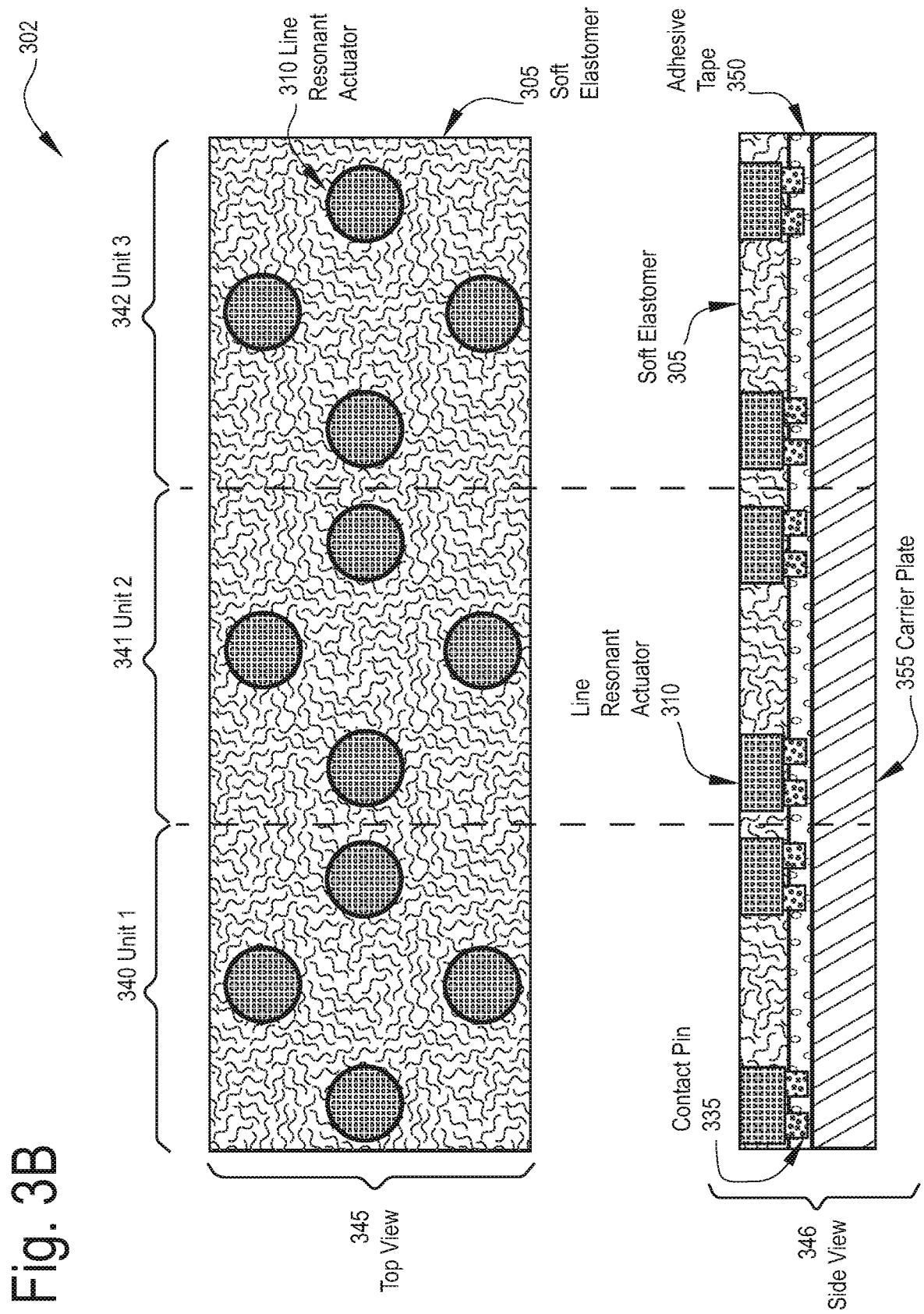

FIG. 3B depicts a top view 345 and a side view 346 of an exemplary wearable 302 in the process of manufacture in accordance with which embodiments may operate.

As shown here for units 1, 2, and 3 (elements 340, 341, and 342) the soft elastomer 305 is now deposited via an elastomer molding process, filling the entirety of the space between the various line resonant actuators 310 which are now embedded within the soft elastomer up to their surface, but not yet singulated (e.g., separated) from the assembly which still resides upon the carrier plate 355.

FIG. 3C depicts a top view 345 and a side view 346 of an exemplary wearable 303 in the process of manufacture in accordance with which embodiments may operate.

As shown here for units 1, 2, and 3 (elements 340, 341, and 342) the entire assembly is now stamped (e.g., cut) resulting in the stamping 360 depicted, thus separating the individual units from the whole assembly, except that they remain upon and affixed to the carrier plate 355.

FIG. 3D depicts an exemplary wearable singulated substrate assembly 304 in the process of manufacture having been singulated from its production assembly in accordance with which embodiments may operate.

As shown here, the units are now singulated (e.g., separated) from one another and removed from their carrier plate, resulting in the substrate structure formed from the soft elastomer 305 within which the line resonant actuators 310 are embedded, the adhesive tape being removed, exposing the contact pads 325 and resulting in a slightly reduced Z height 392 as shown.

With the watch case 315 now provided and having complementary contact pads 325 affixed therein, an adhesive epoxy 320 (non-conductive) is dispensed into the interior of the watch case between the contact pads 325, with the dispensed adhesive epoxy being utilized to fixedly attach the singulated substrate assembly 304 into the watch case 315.

FIG. 3E depicts an exemplary assembled wearable 306 in the process of manufacture in accordance with which embodiments may operate.

As depicted here, the substrate formed by the soft elastomer 305 having the line resonant actuators 310 embedded therein is now assembled into the watch case 315 affixed to the watch case 315 by adhesive epoxy 320 with the contact pads 325 (e.g., optionally connected via conductive epoxy) now forming a continuous electrical connection from the actuators 310 to the remaining electrical internals of the system.

For example, through pressure and heat the substrate assembly is affixed to the interior of the watch case, causing the adhesive epoxy 320 to spread and cure, but without making contact to the contact pads 325, thus leaving a small air gap between the adhesive epoxy 320 and the contact pads 325 in the manner shown.

FIG. 4 depicts a top view 445 and a side view 446 of an exemplary wearable 401 in the process of manufacture in accordance with which alternative embodiments may operate.

Here a variation is provided to the above described process of manufacture, such that the three units under manufacture, units 1, 2, and 3 at elements 440, 441, and 442, are placed upon a carrier plate 455 upon which an adhesive tape 450 is applied. With the adhesive tape 450 in place, the individual line resonant actuators 410 and contact pins 435 are applied upside down to the adhesive tape as before and the soft elastomer has been deposited forming the mold over the units up to the surface of the line resonant actuators 410.

However, an additional patterning operation (e.g., via etch, etc.) has removed or partnered some of the substrate formed from the molded soft elastomer 405, thus removing a portion of the soft elastomer and forming an air gap 465 between the actuators 410 still embedded in surrounding soft elastomer 405.

From the side view 446 it is clearly seen that an air gap 465 now forms a space between the actuators 410 due to partial removal of the soft elastomer between them. However, the assembly remains in-tact as there remains some portion, albeit thinner, of the soft elastomer between the actuators 410, thus keeping the components assembled together as a unit.

From here the units 1, 2, and 3 (elements 440, 441, and 442) under manufacture may be singulated and assembled into the watch case as before.

FIG. 5A depicts a top view 545 and a side view 546 of an exemplary wearable 501 in the process of manufacture in accordance with which embodiments may operate.

As noted above, there exist a variety of means by which to manufacture the wearable and other electronic devices having the localized (non-global) haptic feedback systems using multiple such actuators or tactors. Moreover, there are a variety of different types of actuators. As can be seen here, the line resonant actuators 510 are provided by a third party manufacturer and acquired by the manufacturer of the depicted wearable 511, however, unlike the prior depiction, there are no contact pins for electrically interfacing the actuators 510 into the remaining electrical system of the wearable 501. Rather, wire leads 570 are affixed to the actuators 510 as shown.

Because the wire leads 570 are affixed to the actuators, it is not possible to use the previously depicted method which would necessitate the wire leads being placed downward upon the carrier plate 555 and affixed thereto via the adhesive tape 550, almost certainly damaging the wire leads 570.

Therefore, the process depicted here for units 1, 2, and 3 (elements 540, 541, and 542) instead places the adhesive tape 550 upon the carrier plate and the surface of the actuator 510 to be exposed to the user's skin is placed down onto the adhesive tape, thus leaving the wire leads 570 exposed from the top side of the actuators as depicted.

The soft elastomer 505 may then be molded over the carrier plate and actuators 510 up to the surface of the actuators or even above the surface depending on design considerations, but leaving the wire leads 570 exposed.

Figure 5B:
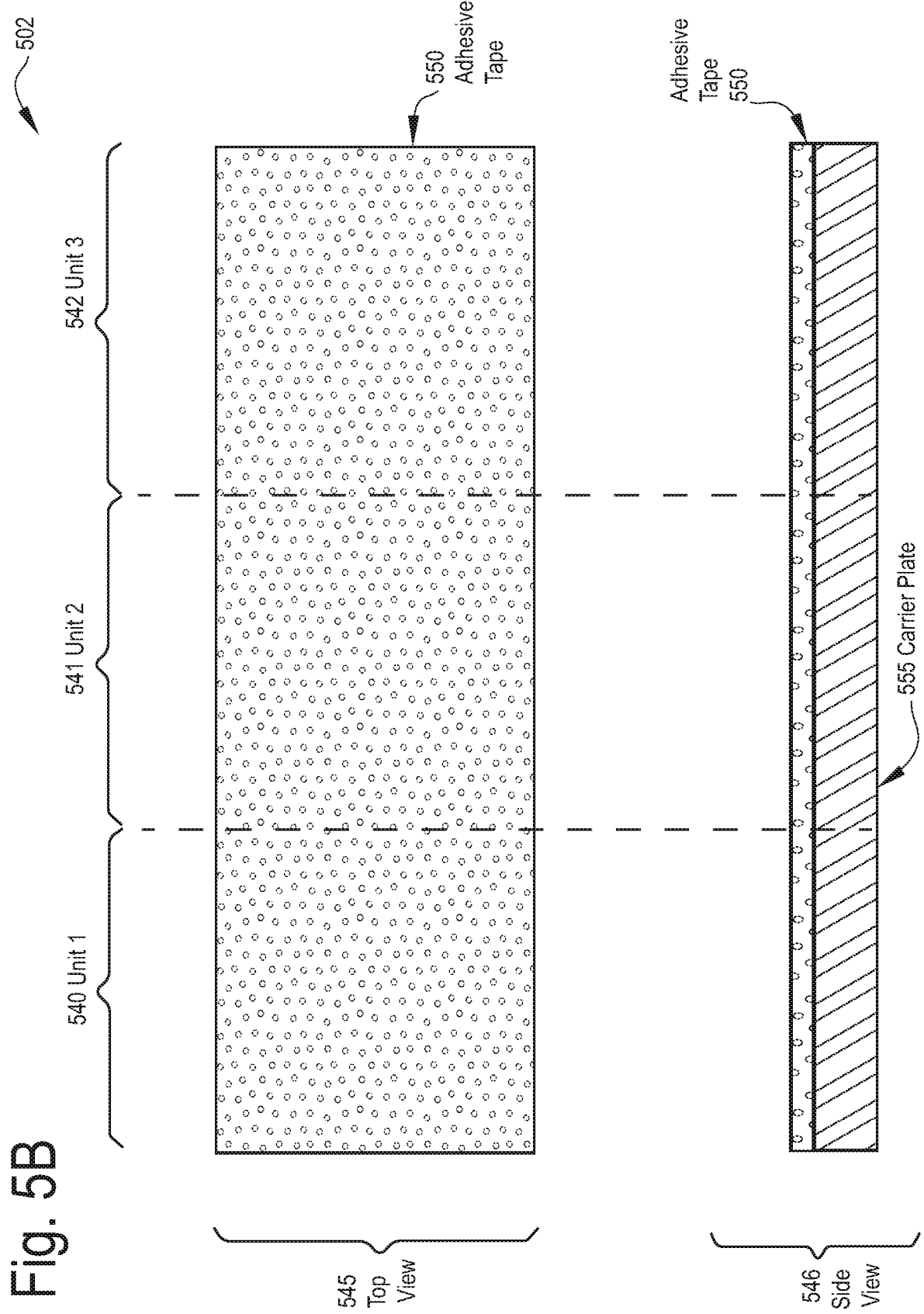

FIG. 5B depicts a top view 545 and a side view 546 of an exemplary wearable 502 in the process of manufacture in accordance with which embodiments may operate.

Unlike the actuators 510 depicted at FIG. 5A, it may also be the case that such actuators arrive without wire leads attached thereto, thus necessitating that they be connected prior to assembly of the substrate and actuators into a system, such as a smart watch.

Therefore, depicted here is such a process, beginning at FIG. 5B with adhesive tape 550 being applied to the carrier plate 555 just as before.

Specifically, units 1, 2, and 3 (elements 540, 541, and 542) are being manufactured via such a process.

Figure 5C:
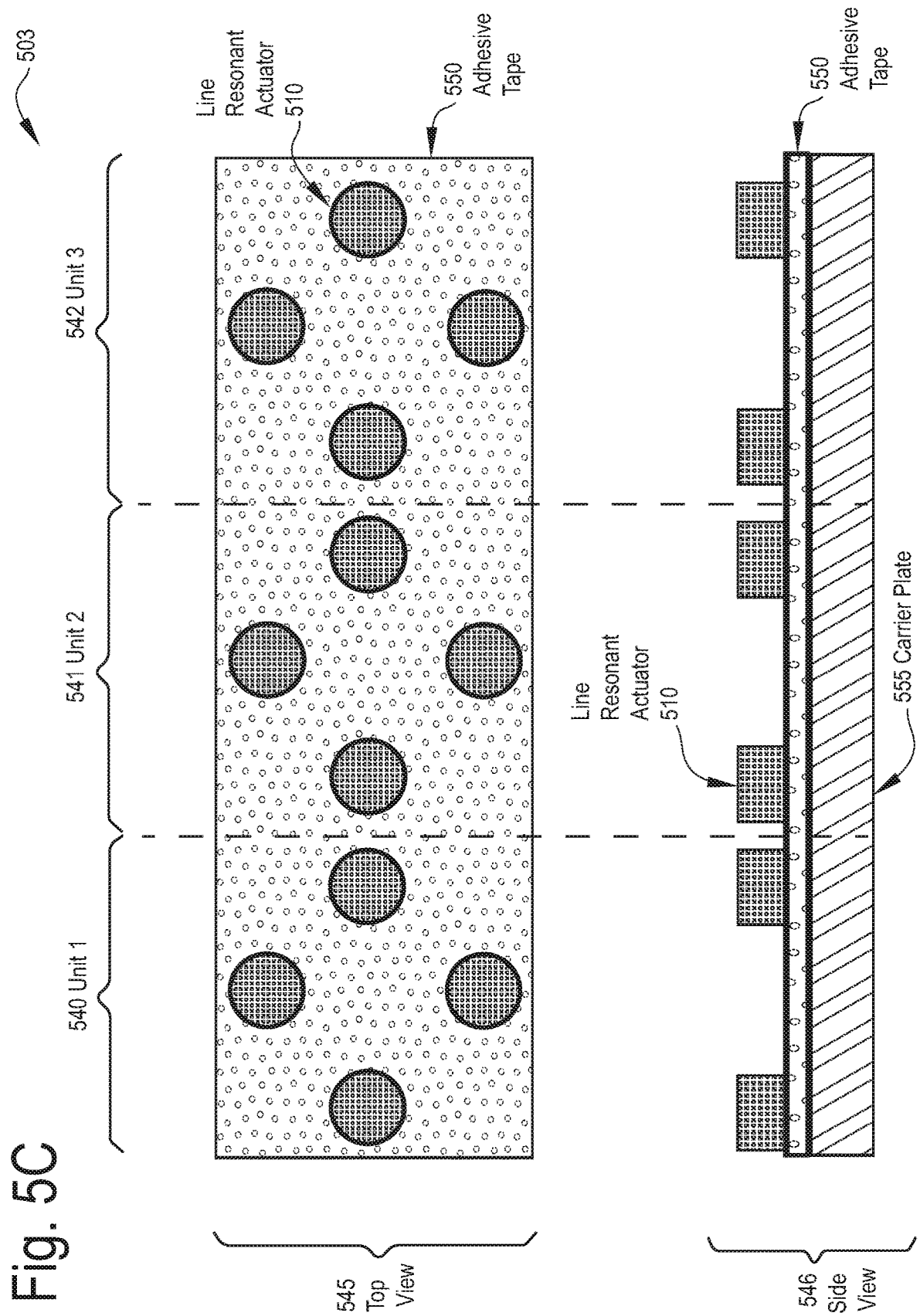

FIG. 5C depicts a top view 545 and a side view 546 of an exemplary wearable 503 in the process of manufacture in accordance with which embodiments may operate.

As shown here for units 1, 2, and 3 (elements 540, 541, and 542) the actuators 510 without their contacts or wire leads are now affixed to the carrier plate 555 via the adhesive tape in the correct locations atop the carrier plate 555, for instance, utilizing a pick and place machine or placement template, etc.

FIG. 5D depicts a top view 545 and a side view 546 of an exemplary wearable 504 in the process of manufacture in accordance with which embodiments may operate.

As shown here, the soft elastomer 505 is now deposited via an elastomer molding process, filling the entirety of the space between the various line resonant actuators 510 which are now embedded within the soft elastomer up to their surface, but not yet singulated (e.g., separated) from the assembly which still resides upon the carrier plate 555 and without having wire leads.

Figure 5E:
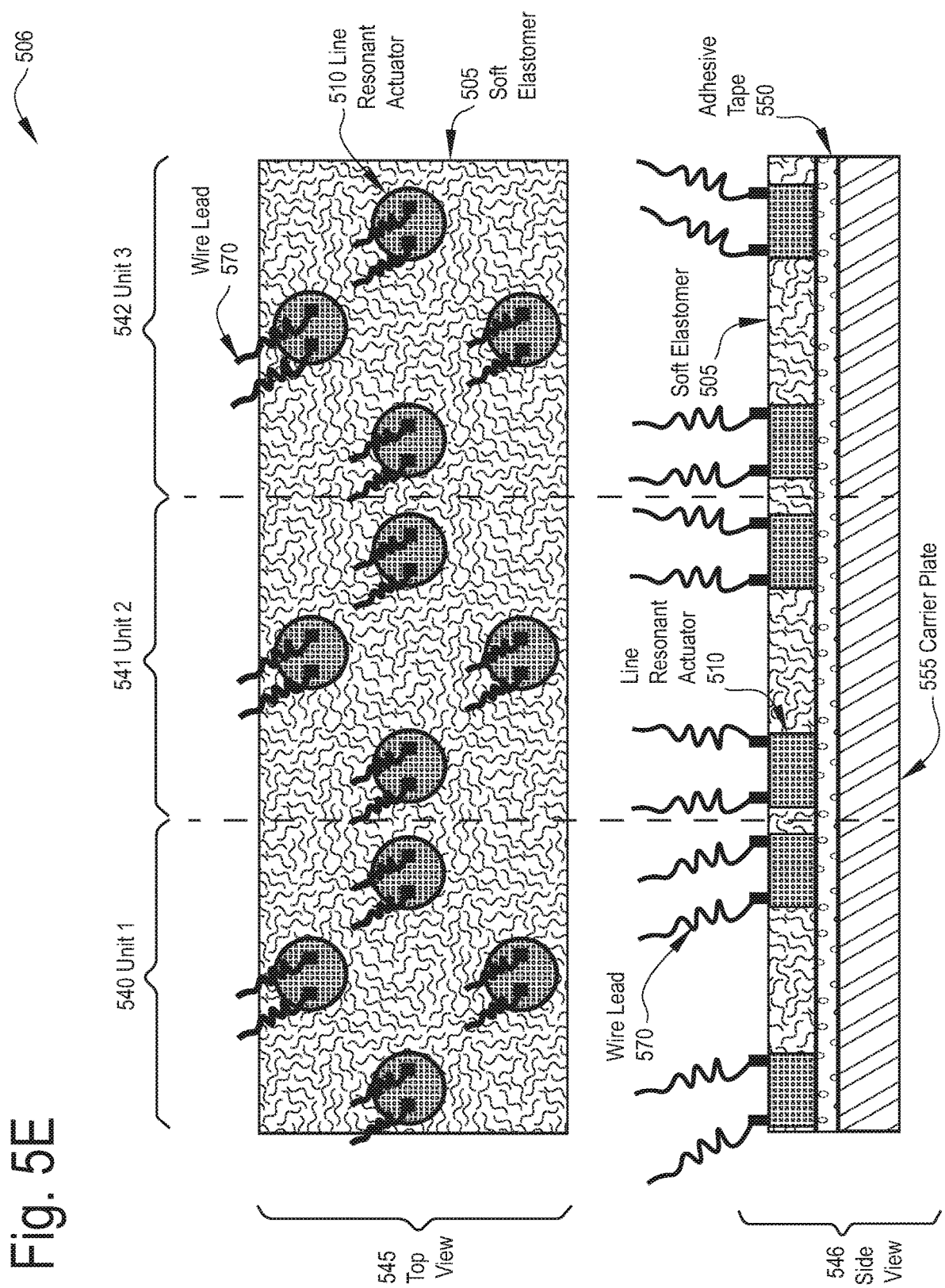

FIG. 5E depicts a top view 545 and a side view 546 of an exemplary wearable 506 in the process of manufacture in accordance with which embodiments may operate.

As shown here, the wire leads 570 which did not come connected with the line resonant actuators 510 are now attached, for instance, via conductive epoxy, solder, or other means, thus resulting in units 1, 2, and 3 (elements 540, 541, and 542) having their actuators 510 embedded within the soft elastomer with wire leads, ready for singulation and assembly.

Figure 5F:
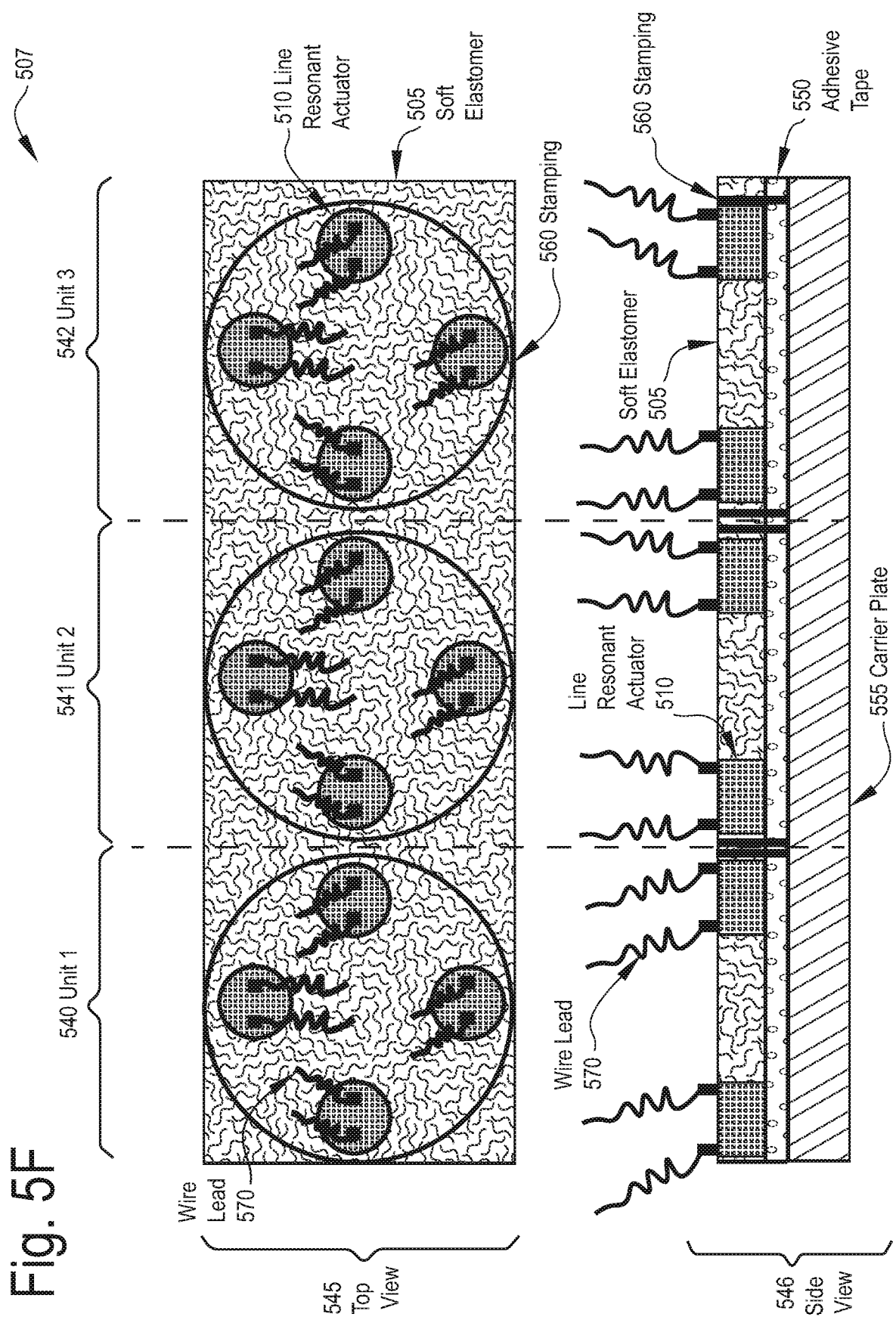

FIG. 5F depicts a top view 545 and a side view 546 of an exemplary wearable 507 in the process of manufacture in accordance with which embodiments may operate.

As shown here, the units 1, 2, and 3 (elements 540, 541, and 542) are now singulated (e.g., separated) from one another via a stamping 560 operation which forms the appropriately shaped substrate assembly with the actuators 510, wire leads 570, and soft elastomer 505 substrate ready for removal from the carrier plate 555 and assembly.

The units 1, 2, and 3 (elements 540, 541, and 542) are next removed (e.g., via a chemical cleaning process or mechanical removal from the carrier plate, etc.) and assembled as shown previously at FIGS. 3D and 3E.

Figure 6:
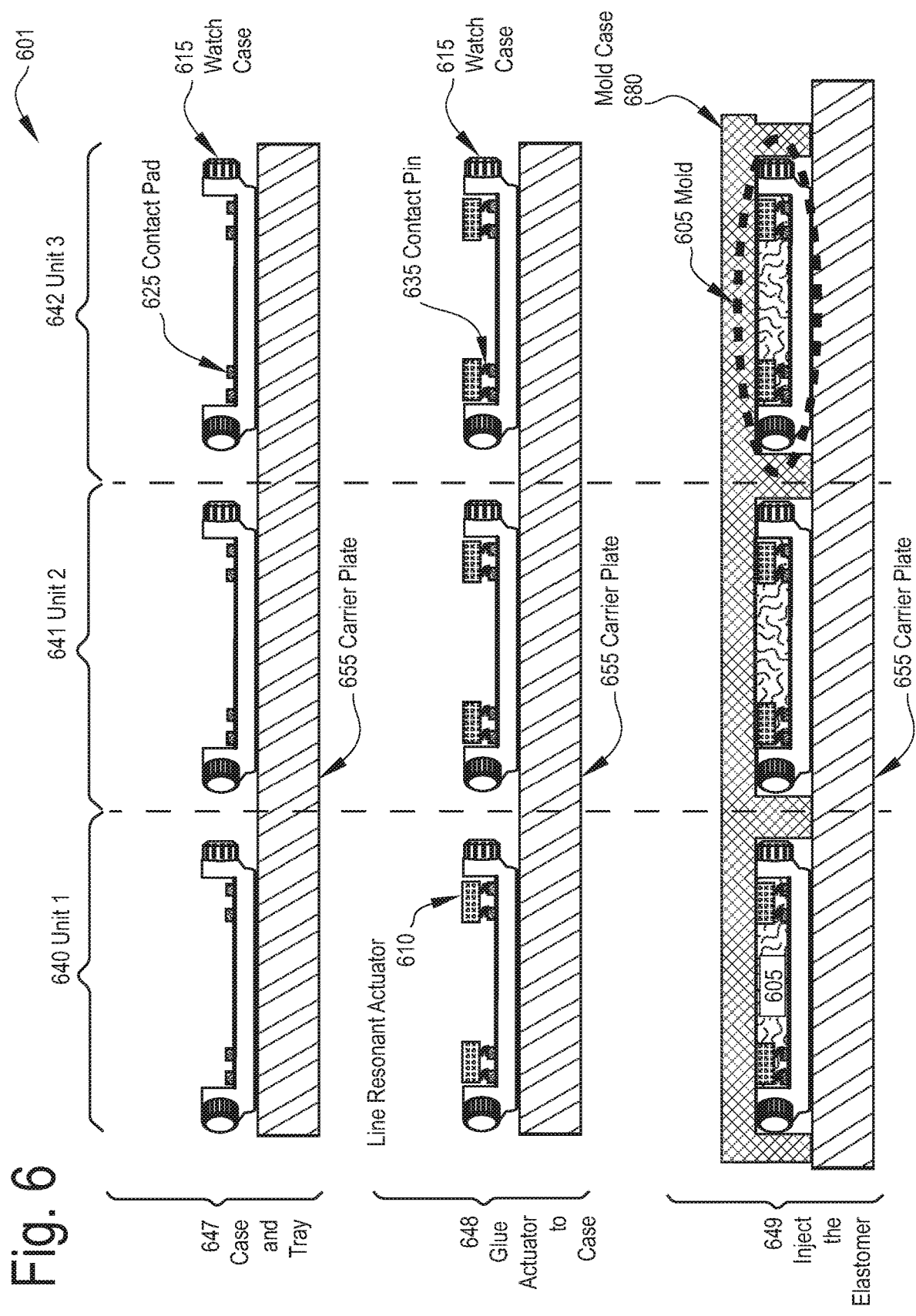

FIG. 6 depicts a series of side views providing a process 601 of manufacture for an exemplary wearable device in accordance with which alternative embodiments may operate.

As depicted here, a variation is provided to the above described processes of manufacture, such that the three units under manufacture, units 1, 2, and 3 at elements 640, 641, and 642, are built up within their respective watch cases 615, with the watch cases being placed upon the carrier plate 655 at case and tray operation 647 as shown.

Within the watch cases it may be observed that the electrical contact pads 625 have been glued or affixed via conductive epoxy to the interior of the watch case 615 ready to receive the actuators.

At operation 648, the actuators are glued or affixed via conductive epoxy to the watch cases 615 as shown. The actuators may be attached via a joint formation process such as solder or glue or epoxy. Here a compliant (flexible) contact pin is utilized for the connection is depicted. Regardless, with the line resonant actuators 610 now being affixed to the contact pins 635, the units 1, 2, and 3 at elements 640, 641, and 642, are ready for injection molding.

Depicted at operation 649 the elastomer mold 605 is injected into the interior of the watch case through the mold case 680 or mold form via an injection molding process, thus proving an even and smooth surface at the top side of the actuators 610 now embedded within the elastomer mold 605. Note that the watch case 615 is upside down and the top surface of the actuators beneath the mold case 680 will make contact with the user's skin once in use.

Nonetheless, the mold case 680 may now be removed and the units 1, 2, and 3 at elements 640, 641, and 642, which are already singulated as each resides within its own watch case, may be removed from the carrier plate 655 for final processing and packaging operations.

FIG. 7A depicts a top view 745 and a side view 746 of an exemplary wearable 701 in the process of manufacture in accordance with which alternative embodiments may operate.

For instance, another method of integrating haptic actuators in such systems is depicted here, in which the actuators (not yet installed) utilize a tight press fit into openings of the watch case formed within a round elastomeric gasket 782 or ring. The round elastomeric gasket 782 may be formed within the watch case 715 through an injection molding process to leave the openings within the round elastomeric gasket 782 into which the actuators may subsequently be placed. Additionally depicted is the air gap 730 formed between the four round elastomeric gaskets 782 or rings of the watch case which provide additional mechanical decoupling and vibration dampening such that the haptic feedback signal is maximized into the user's skin and does not simply vibrate the entire system (e.g., the watch case) as a single unit.

Such an assembly technique may be applied on other substrates as well, such as a keyboard or a thick PCB, etc.

Figure 7B:
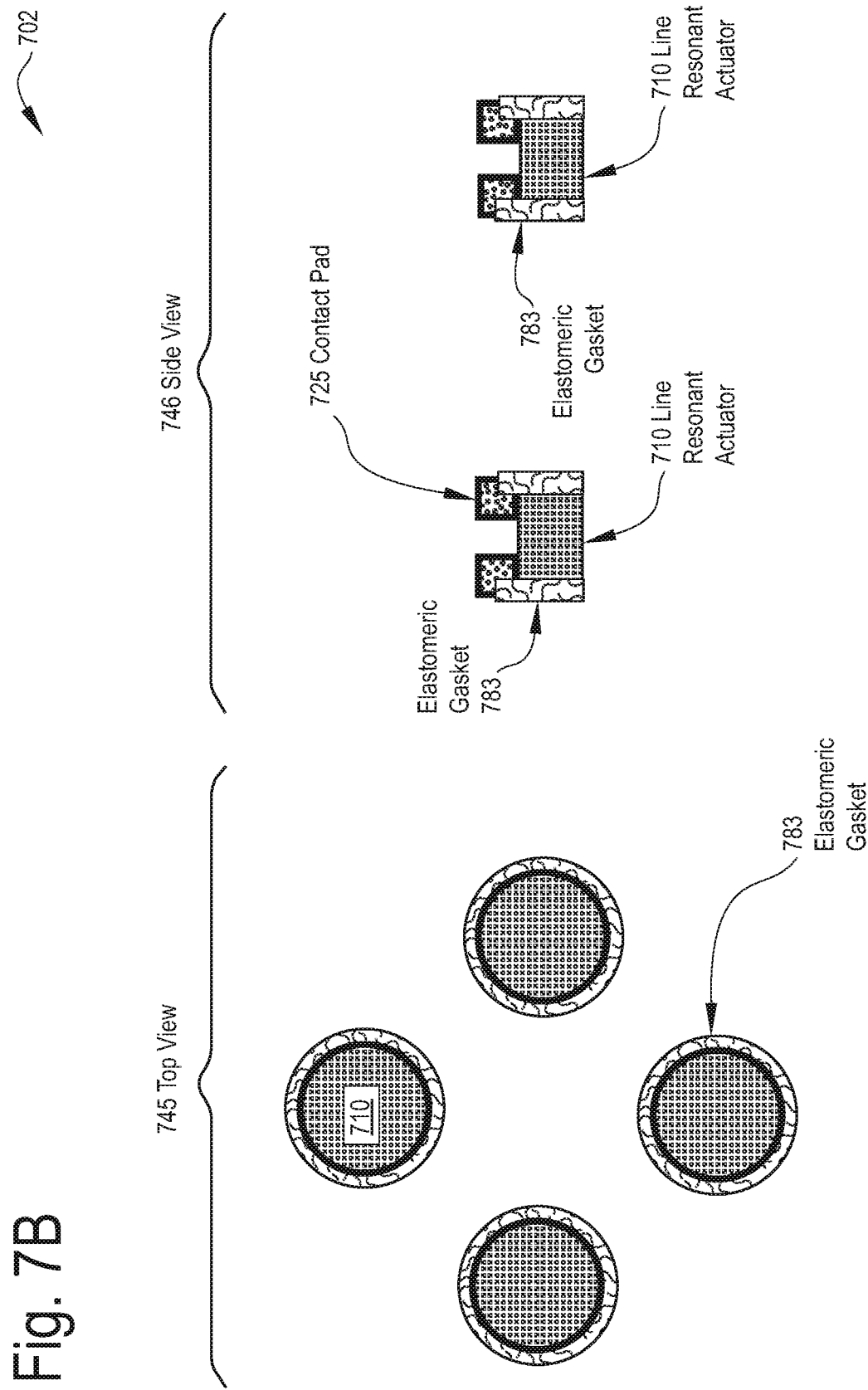

FIG. 7B depicts a top view 745 and a side view 746 of an exemplary wearable 702 in the process of manufacture in accordance with which alternative embodiments may operate.

As depicted here, the actuators 710 are tightly fit into elastomeric gaskets 783 outside of the watch case or other system to receive them. As can be seen from the side view 746, the elastomeric gasket 783 or ring surrounds the entirety of the line resonant actuator 710 leaving the contact pads 725 exposed ready to electrically interface to the remainder of the electronics, such as a substrate assembly, etc. Actuators 710 having wire leads could be likewise accommodated in the same manner.

FIG. 7C depicts a top view 745 and a side view 746 of an exemplary wearable 703 in the process of manufacture in accordance with which alternative embodiments may operate.

Depicted here, the actuators 710 from FIG. 7B which are encompassed within their elastomeric gaskets 783 or rings are now press fit into the watch case 715 having the openings formed by the round elastomeric gasket 782 as depicted at FIG. 7A, a representation of which is provided via the side view 746 at watch case 715. Notably, the elastomeric gasket 783 and actuator 710 is inverted such that the contact pads 725 are now downward for press fit assembly into the watch case 715.

According to certain embodiments, an elastomer adhesive surrounding the actuators 710 may be painted, sprayed or dipped on so as to affix the round elastomeric gasket 782 and actuator assembly to the watch case 715.

According to one embodiment, the round elastomeric gasket 782 and actuator assembly is press fit into the watch case. Alternatively, the round elastomeric gasket 782 and actuator assembly may be molded into the watch case 715. Alternatively, the watch case and its elastomeric gasket 782 may be heated to cause them to expand, after which the round elastomeric gasket 782 and actuator assembly is placed into position, and the watch case and elastomeric gasket 782 are permitted to cool, this fixedly attaching the round elastomeric gasket 782 and actuator assembly to the watch case. Alternatively, the round elastomeric gasket 782 and actuator assembly may be positioned within the watch case 715 and then chemically cured to fixedly attach to the watch case 715.

FIG. 8 depicts a top view 845 and a side view 846 of an exemplary wearable 801 in the process of manufacture in accordance with which alternative embodiments may operate.

In particular, the watch case 815 as depicted here again has elastomeric gaskets 881 into which the line resonant actuator 810 assembly may be placed surrounded by an air gap 830 to dampen vibration. However, here the elastomeric gaskets 881 are not round, but exhibit a wavy or anomalous shape, as can be seen upon careful expansion of the elastomeric gaskets 881 depicted via the top view 845.

Such a shape creates further separation and mechanical decoupling from the actuators 810 and the watch case, while still permitting them to be held fast within the watch case 815 assembly. Due to the anomalous or wavy shape of the elastomeric gaskets 881, only the tangential points are in contact between the actuator 810 and the elastomeric gasket 881 with the opposing tangential point being in contact with the watch case 815. In such a way, there is a reduced material contact which in turn contributes to a reduction or dampening of vibrations through the watch case resulting in greater mechanical decoupling of the actuators 810 from the watch case.

As before, the non-round or wavy elastomeric gasket 881 and actuator assembly is then press fit into the watch case 815 as shown via the side view 846.

Figure 9:
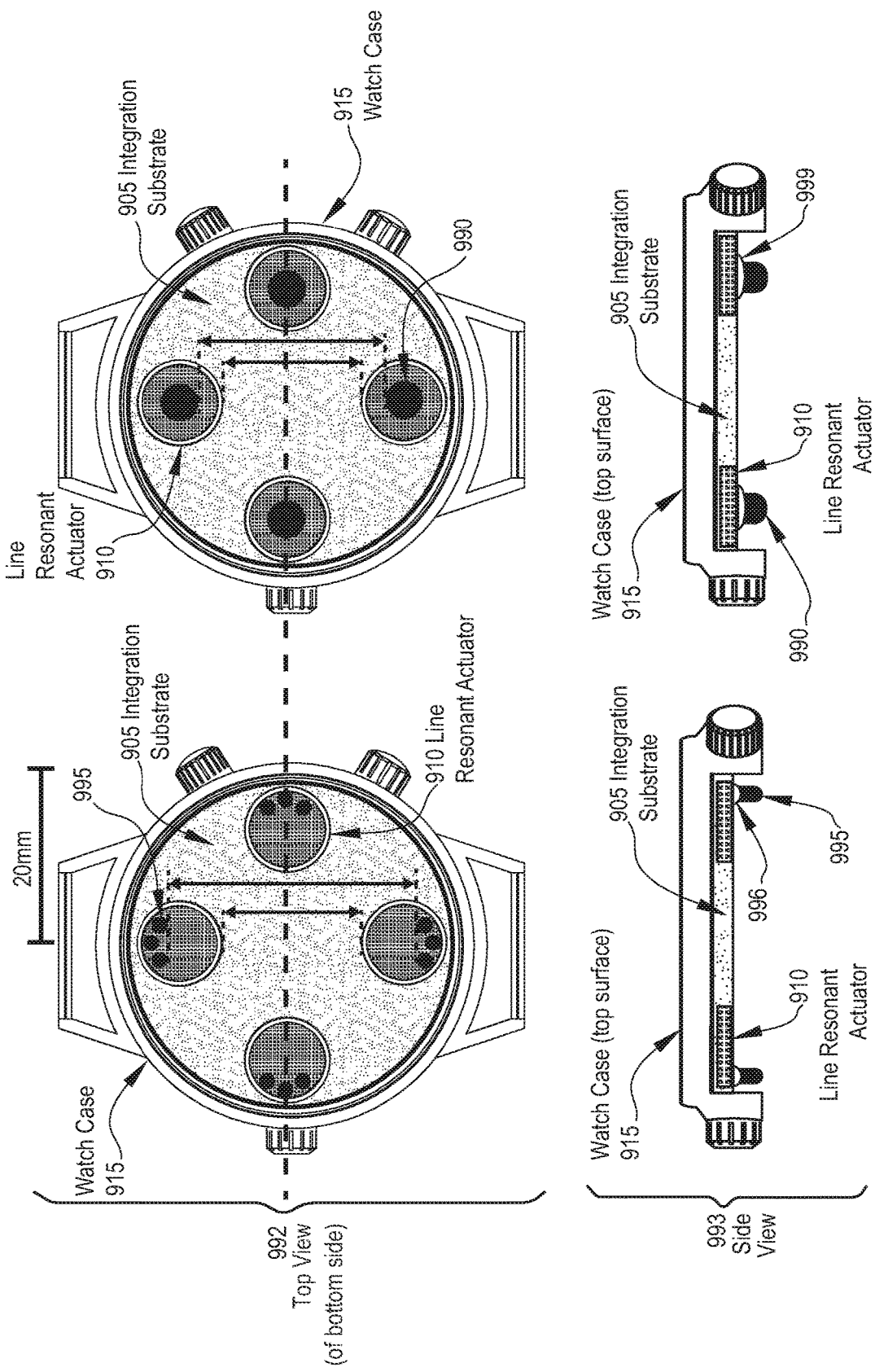

FIG. 9 depicts a top view 992 and a side view 993 of an exemplary wearable 901 in accordance with which embodiments may operate.

The top view 992 shows the bottom side of the wearable 901, and in particular, it may be observed from on the left-hand side a watch case 915 having multiple line resonant actuators 910 embedded within an integration substrate 905. Notably, the assembled pin 995 pattern at each of the actuators 910 of the watch case on the left are structured in such a way that they are positioned towards the outer perimeter of the watch case 915 at the edge of each actuator 910.

Below via the left-hand side view 993 it may be observed that the assembled pin 995 pattern at each actuator is positioned to the very farthest edges of the actuators so as to maximize the distances between the point of physical contact made between the pins 995 of the respective actuators 910.

With reference again to the top view 992 of the bottom side of the watch case 915, it may be observed on the right-hand side that the larger centered pins 990 affixed to the actuators 910 of the right-hand side watch case 915 reduce the total distance between the points of contact by the larger pins 990 and the user's skin where physical contact is made. Referring to the bottom right at the side view 993 again it may be seen that the larger centered pins 990 are closer together measured from on-center than the smaller pins 995 of the watch case 915 on the left.

Additionally depicted by the cross-section side view 993 on the bottom is the use of a non-conductive epoxy 996 for mechanical bonding each of the actuators 910 with the smaller pins 995 on the left or the non-conductive epoxy 999 for mechanical bonding each of the actuators 910 with the larger pins 990 on the right.

As shown here, the smaller pins 995 form an outward pin pattern on the left with a greater total pitch distance between them than the larger centered pins 990 on the right. The different configurations of pin patterns on the actuators 910 which may be assembled each reduce the contact area from the actuators 910 with the user's skin. Both the pattern formed by the smaller pins 995 or the lone centered per-actuator pin 990 as well as the pin's physical characteristics such as length, width, finish, etc., are design parameters which may be specified by any particular design and design objectives.

Off-the-shelf actuators available today for the purposes for global haptic feedback systems fall into one of the following categories: a) Eccentric Rotating Mass Motor (ERM) actuators formed by either rectangular or coin-cell form factors; b) Linear Resonant Actuators (LRAs) such as those utilized in the exemplary depicted embodiments; and c) Piezoelectric actuators. For localized haptic feedback systems in wearable electronics such as those described herein, the form factor of devices such as smart-watches, fitness-bands, smartphones, etc. is limited because conventional rectangular ERMs simply cannot satisfy the above-mentioned two point discrimination threshold requirements for human perception.

Similarly, coin-cell ERMs or LRAs presently available in the marketplace today have at minimum an 8 mm diameter. Consequently, even for a 35-38 mm two point discrimination threshold, the diameter of the smartwatch must be larger than 51 mm, which is far too large. Watches for male users range between 38 mm-50 mm for the largest watches among them whereas watches for females tend to be much smaller or at least on the smaller end of the range.

Presently available smartwatches on the market nowadays all measure less than 48 mm in diameter. For instance, the Samsung Gear S2 is 42 mm, the Intel Tag Heuer Carrera Connected Watch is 46 mm.

Piezoelectric actuators in the market have relatively large X-Y form factors when compared to the coin cell LRAs which produce similar actuation displacements.

Coin-cell form factor ERMs or LRAs are therefore considered preferable to bring the localized feedback techniques described herein to consumer electronic products with sufficiently small form factors. However, so as to achieve the two point discrimination threshold requirements of a human user's wrist where many such wearables are expected to be worn (e.g., fitness bands, health monitors, smart watches, etc.), it is desirable to maximize the distance between the local actuators so as to maximize user's ability to perceive the localized actuations of such devices due to the distances exceeding the two point discrimination threshold for any given user.

By reducing the contact area of the actuator with the user's skin as is done in the left hand watch case 915 via the smaller pins 995, without changing the diameter of the actuator itself so as to avoid negatively affecting the mechanical properties of the actuators 910, a larger total pitch between two actuators 910 may thus be achieved.

New actuator case designs by third party suppliers may provide such actuators and pin configurations pursuant to specified design requirements or alternatively assembly of such pin configurations onto off-the-shelf actuators may be utilized to achieve desired requirements.

FIG. 10A depicts a series of side views providing a process 1000 of manufacture for an exemplary wearable device in accordance with which alternative embodiments may operate.

As depicted here, manufacturing and integration of the haptics elements begins with operation 1001 where the watch case 1015 system is integrated with the line resonant actuators 1010 into an integration substrate 1005 such as a soft elastomer, or other substrate or assembly material.

At operation 1002, adhesive or epoxy 1096 is dispensed upon the previously integrated actuators 1010 at the appropriate placement location for the desired pin placement configuration. Such adhesives or epoxies 1096 may be air curable or thermally curable or UV curable or a combination of these processes. Placement of the adhesive may be performed by dispense means such as those common to the semiconductor packaging industry and optimized in its position and quantity according to the dot size of the pin to be attached.

According to a particular embodiment solder paste is screen printed onto the actuator 1010 and then the pins are placed and re-flow affixes the pins to the actuator via the solder paste.

At operation 1003, the pins 1095 are then placed using standard component placement technologies, such as tools and processes known for die, board, and passive component placement including automated pick and place machines. Depending on the aspect ratio (height/width) of the pin there may or may not be need for a short thermal step to initially fix it in position so as to inhibit any tipping or misalignment of the placed pin. If necessary, such pick and place equipment is readily available which is capable of placing, holding, performing an initial quick cure or bond, and then release, such that processing may continue.

In another embodiment all of the pins are placed simultaneously in a batch for a single actuator or as a batch for an entire watch case assembly or even as a batch for multiple units under production.

Once all of the pins are placed, processing continues to operation 1004 where an adhesive or epoxy cure is performed to ensure a permanent bond between the pin and the actuator is formed. For instance, depending upon the particular adhesive or epoxy utilized, such a cure operation may be performed by a UV-light chamber (for UV cure), or in an oven if thermal cure is required.

Figure 10B:
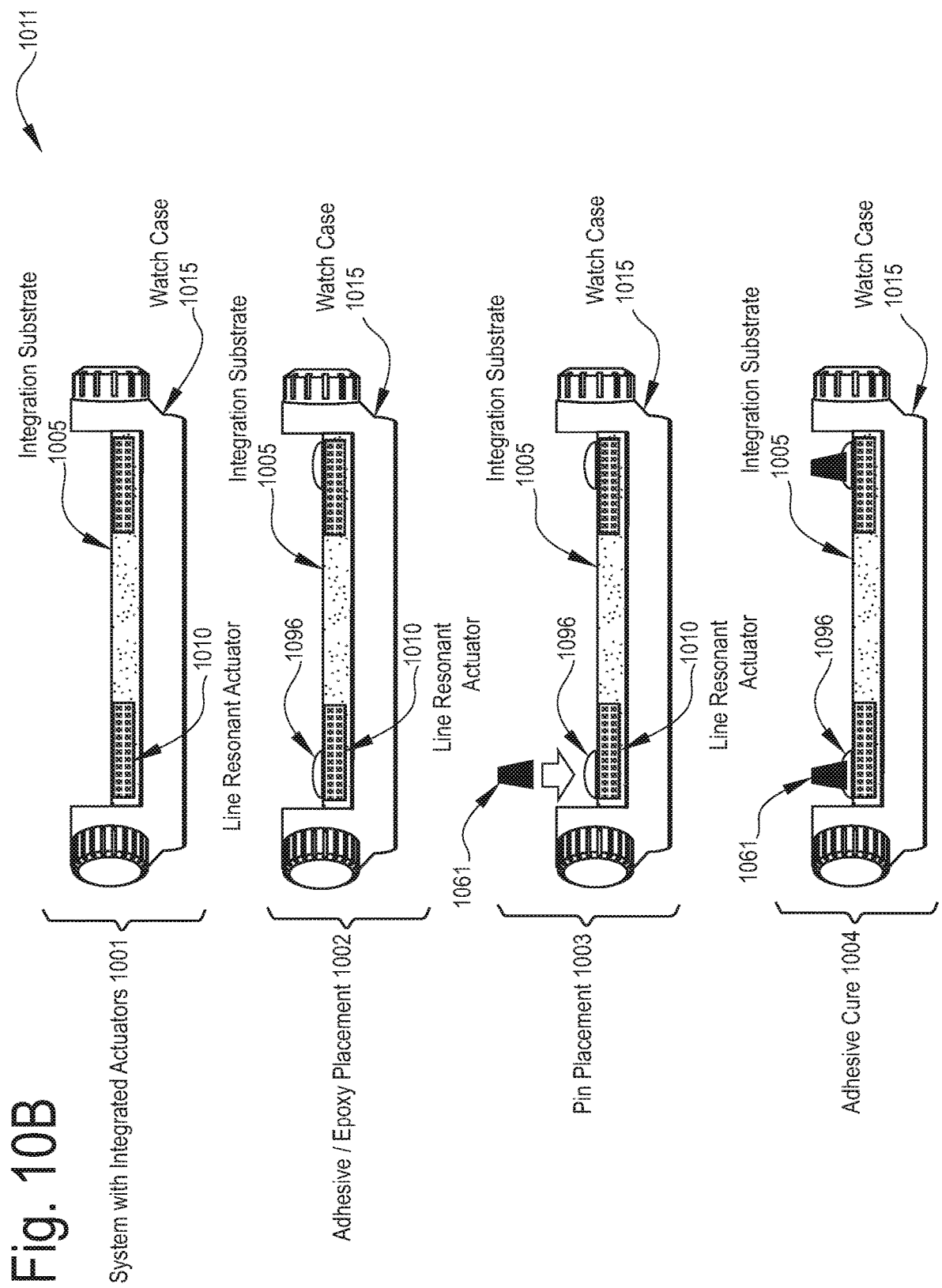

FIG. 10B depicts another series of side views providing a process 1011 of manufacture for an exemplary wearable device in accordance with which alternative embodiments may operate.

The depicted process 1011 here is identical to the process 1000 of FIG. 10A, except that different shaped pins 1061 are utilized at the pin placement 1003 operation.

More particularly, the pins 1061 shown here have a small flat top which makes them easier to handle and manipulate by automated pick and place equipment. The geometry of such pins 1061 may be optimized to fit the tactile and pick and place machine handling requirements simultaneously without detriment to the other. For example, the rounded pins may exhibit a problem with vacuum pick and place equipment whereas a conical shaped pin may work equally well for human perceptibility yet provide better pick and place handling characteristics at the time of manufacture.

Figure 11:
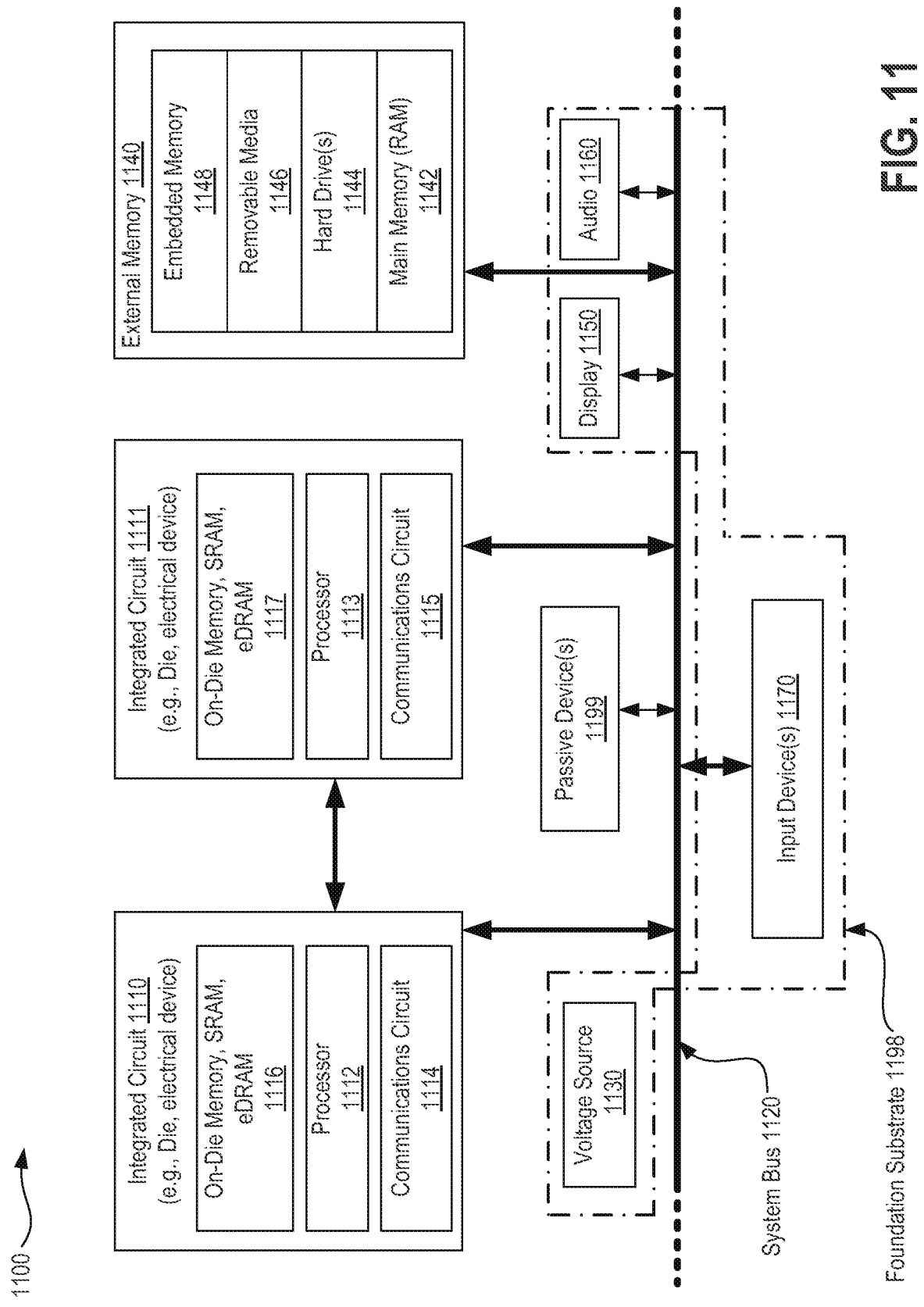

FIG. 11 is a schematic of a computer system 1100 in accordance with described embodiments. The computer system 1100 (also referred to as the electronic system 1100) as depicted can embody means for implementing increased human perception of haptic feedback systems, according to any of the several disclosed embodiments and their equivalents as set forth in this disclosure. The computer system 1100 may be a mobile device such as a netbook computer. The computer system 1100 may be a mobile device such as a wireless smartphone or tablet. The computer system 1100 may be a desktop computer. The computer system 1100 may be a hand-held reader. The computer system 1100 may be a server system. The computer system 1100 may be a supercomputer or high-performance computing system.

In accordance with one embodiment, the electronic system 1100 is a computer system that includes a system bus 1120 to electrically couple the various components of the electronic system 1100. The system bus 1120 is a single bus or any combination of busses according to various embodiments. The electronic system 1100 includes a voltage source 1130 that provides power to the integrated circuit 1110. In some embodiments, the voltage source 1130 supplies current to the integrated circuit 1110 through the system bus 1120.

Such an integrated circuit 1110 is electrically coupled to the system bus 1120 and includes any circuit, or combination of circuits according to an embodiment. In an embodiment, the integrated circuit 1110 includes a processor 1112 that can be of any type. As used herein, the processor 1112 may mean any type of circuit such as, but not limited to, a microprocessor, a microcontroller, a graphics processor, a digital signal processor, or another processor. In an embodiment, the processor 1112 includes, or is coupled with, electrical devices having gradient encapsulant protection, as disclosed herein.

In accordance with one embodiment, SRAM embodiments are found in memory caches of the processor. Other types of circuits that can be included in the integrated circuit 1110 are a custom circuit or an application-specific integrated circuit (ASIC), such as a communications circuit 1114 for use in wireless devices such as cellular telephones, smart phones, pagers, portable computers, two-way radios, and similar electronic systems, or a communications circuit for servers. In an embodiment, the integrated circuit 1110 includes on-die memory 1116 such as static random-access memory (SRAM). In an embodiment, the integrated circuit 1110 includes embedded on-die memory 1116 such as embedded dynamic random-access memory (eDRAM).

In accordance with one embodiment, the integrated circuit 1110 is complemented with a subsequent integrated circuit 1111. Useful embodiments include a dual processor 1113 and a dual communications circuit 1115 and dual on-die memory 1117 such as SRAM. In accordance with one embodiment, the dual integrated circuit 1110 includes embedded on-die memory 1117 such as eDRAM.

In one embodiment, the electronic system 1100 also includes an external memory 1140 that in turn may include one or more memory elements suitable to the particular application, such as a main memory 1142 in the form of RAM, one or more hard drives 1144, and/or one or more drives that handle removable media 1146, such as diskettes, compact disks (CDs), digital variable disks (DVDs), flash memory drives, and other removable media known in the art. The external memory 1140 may also be embedded memory 1148 such as the first die in a die stack, according to an embodiment.

In accordance with one embodiment, the electronic system 1100 also includes a display device 1150 and an audio output 1160. In one embodiment, the electronic system 1100 includes an input device 1170 such as a controller that may be a keyboard, mouse, trackball, game controller, microphone, voice-recognition device, or any other input device that inputs information into the electronic system 1100. In an embodiment, an input device 1170 is a camera. In an embodiment, an input device 1170 is a digital sound recorder. In an embodiment, an input device 1170 is a camera and a digital sound recorder.

As shown herein, the integrated circuit 1110 can be implemented in a number of different embodiments, including means for implementing increased human perception of haptic feedback systems into semiconductor substrate package, according to any of the several disclosed embodiments and their equivalents, an electronic system, a computer system, one or more methods of fabricating an integrated circuit, and one or more methods of fabricating an electronic assembly that includes a package substrate or a semiconductor package having therein means for implementing increased human perception of haptic feedback systems, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates and semiconductor packages having means for implementing increased human perception of haptic feedback systems into semiconductor substrate package embodiments and their equivalents. A foundation substrate 1198 may be included, as represented by the dashed line of FIG. 11. Passive devices 1199 may also be included, as is also depicted in FIG. 11.

Figure 12:
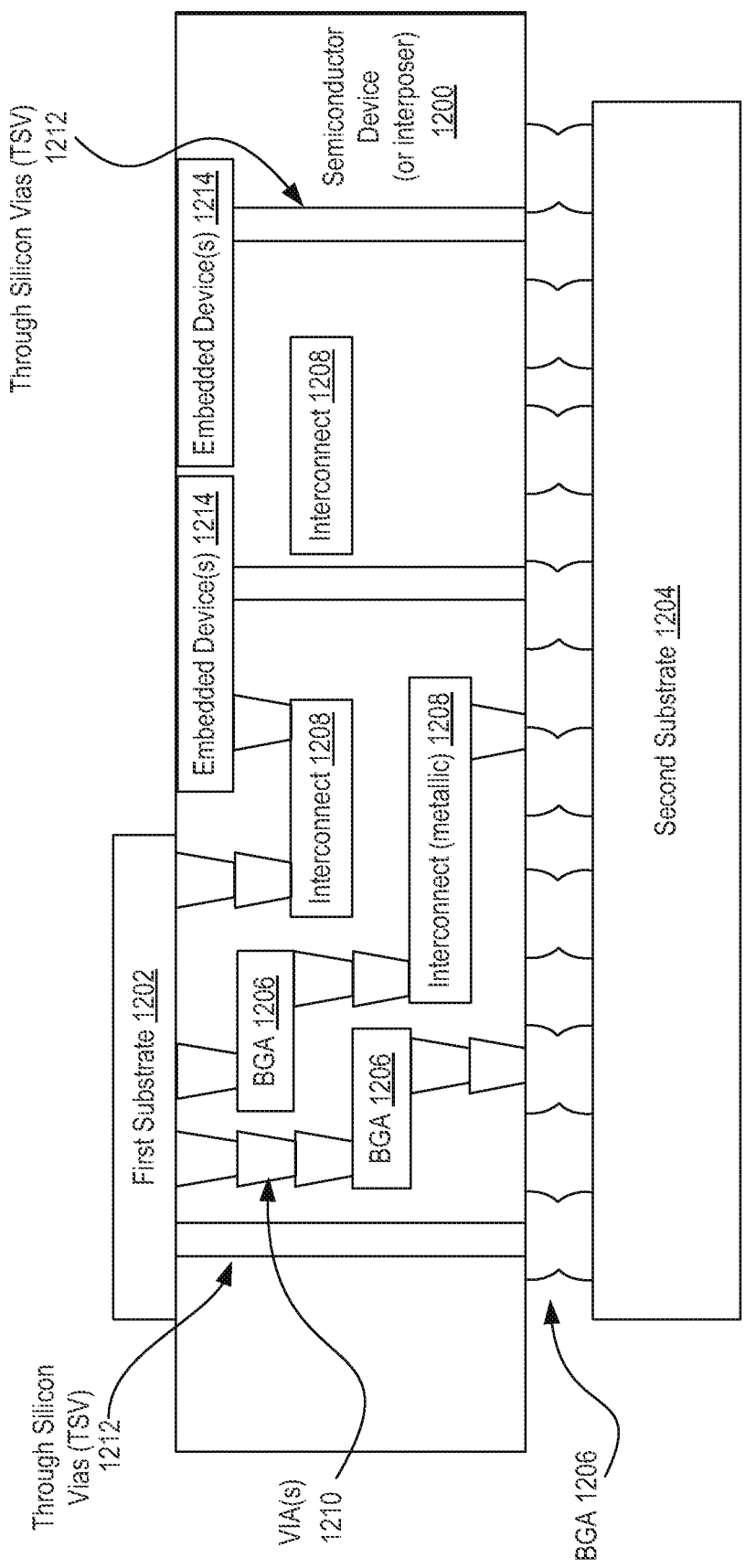

FIG. 12 illustrates a semiconductor device 1200 (or an interposer) that includes one or more described embodiments. The interposer 1200 is an intervening substrate used to bridge a first substrate 1202 to a second substrate 1204. The first substrate 1202 may be, for instance, an integrated circuit die. The second substrate 1204 may be, for instance, a memory module, a computer motherboard, or another integrated circuit die. Generally, the purpose of an interposer 1200 is to spread a connection to a wider pitch or to reroute a connection to a different connection. For example, an interposer 1200 may couple an integrated circuit die to a ball grid array (BGA) 1206 that can subsequently be coupled to the second substrate 1204. In some embodiments, the first and second substrates 1202/1204 are attached to opposing sides of the interposer 1200. In other embodiments, the first and second substrates 1202/1204 are attached to the same side of the interposer 1200. And in further embodiments, three or more substrates are interconnected by way of the interposer 1200.

The interposer 1200 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1208 and vias 1210, including but not limited to through-silicon vias (TSVs) 1212. The interposer 1200 may further include embedded devices 1214, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1200. In accordance with described embodiments, apparatuses or processes disclosed herein may be used in the fabrication of interposer 1200.

Figure 13:
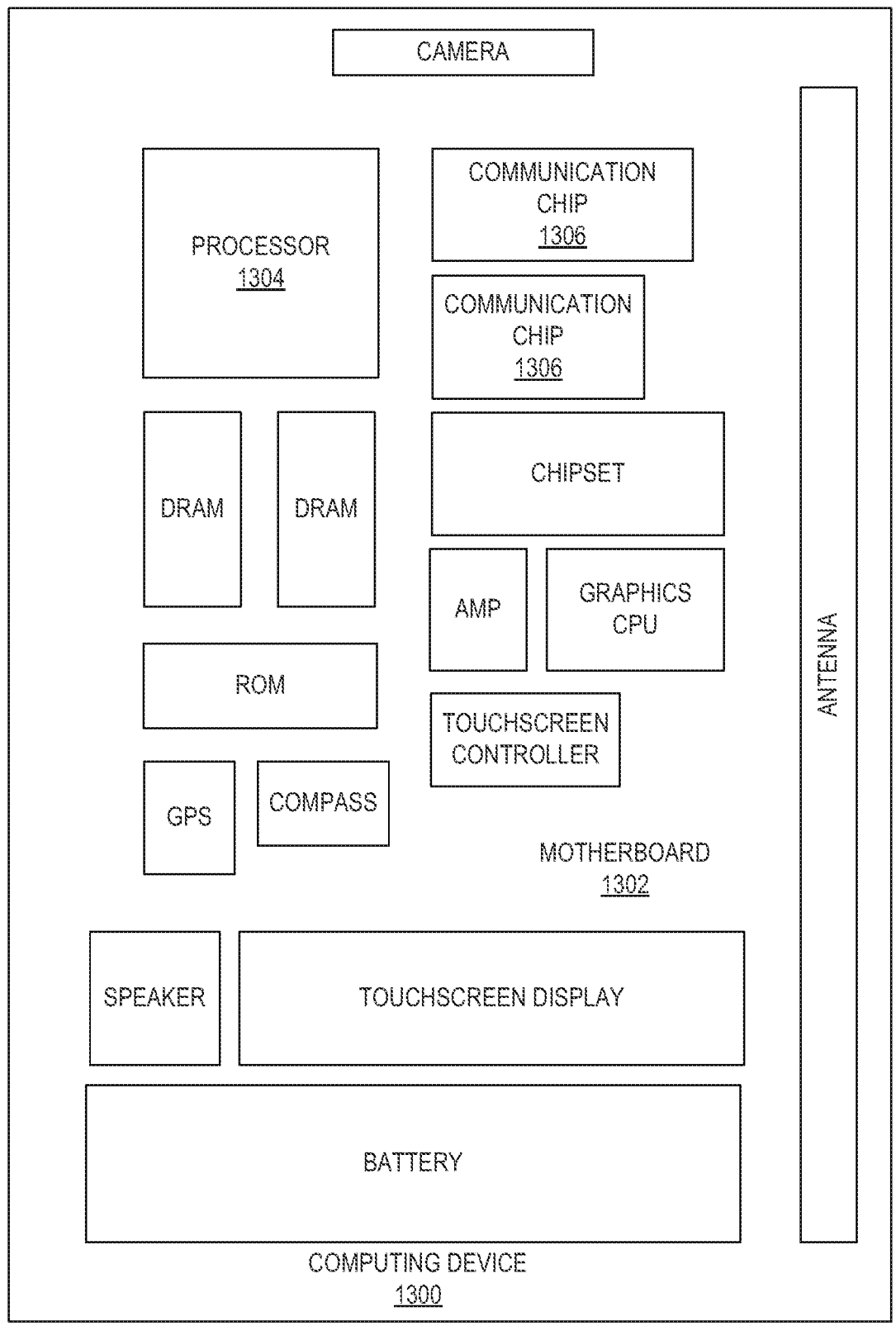

FIG. 13 illustrates a computing device 1300 in accordance with one implementation of the invention. The computing device 1300 houses a board 1302. The board 1302 may include a number of components, including but not limited to a processor 1304 and at least one communication chip 1306. The processor 1304 is physically and electrically coupled to the board 1302. In some implementations the at least one communication chip 1306 is also physically and electrically coupled to the board 1302. In further implementations, the communication chip 1306 is part of the processor 1304.

Depending on its applications, computing device 1300 may include other components that may or may not be physically and electrically coupled to the board 1302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1306 enables wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1300 may include a plurality of communication chips 1306. For instance, a first communication chip 1306 may be dedicated to shorter range wireless communications such as Wi-Fi and Bluetooth and a second communication chip 1306 may be dedicated to longer range wireless communications such as GPS, EDGE, GPRS, CDMA, WiMAX, LTE, Ev-DO, and others.

The processor 1304 of the computing device 1300 includes an integrated circuit die packaged within the processor 1304. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 1306 also includes an integrated circuit die packaged within the communication chip 1306. In accordance with another implementation of the invention, the integrated circuit die of the communication chip includes one or more devices, such as MOS-FET transistors built in accordance with implementations of the invention.

In further implementations, another component housed within the computing device 1300 may contain an integrated circuit die that includes one or more devices, such as MOS-FET transistors built in accordance with implementations of the invention.

In various implementations, the computing device 1300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1300 may be any other electronic device that processes data.

Figure 14:
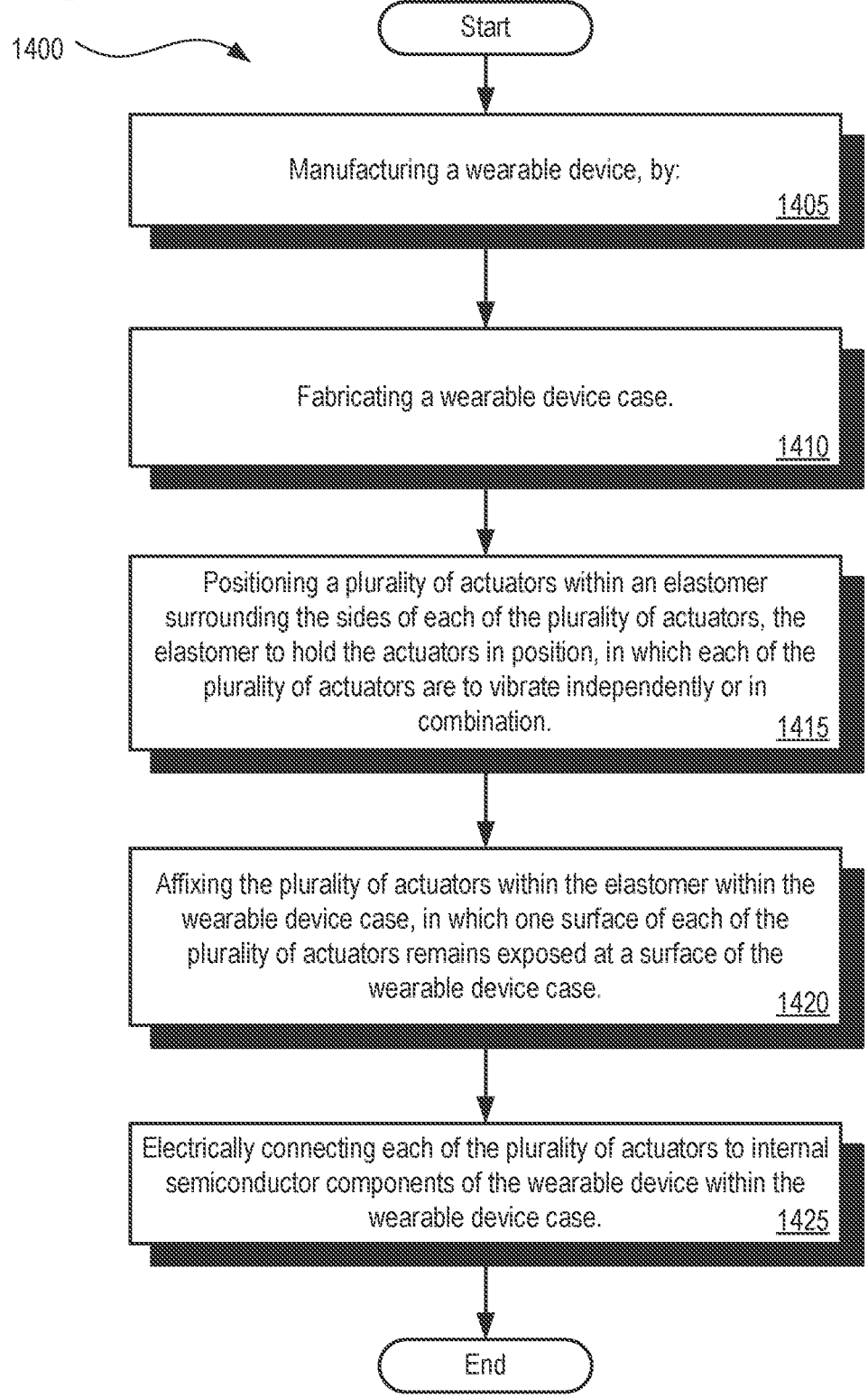

FIG. 14 is a flow diagram illustrating a method 1400 for means for implementing increased human perception of haptic feedback systems in accordance with described embodiments. Some of the blocks and/or operations listed below are optional in accordance with certain embodiments. The numbering of the blocks presented is for the sake of clarity and is not intended to prescribe an order of operations in which the various blocks must occur. Additionally, operations from flow 1400 may be utilized in a variety of combinations.

At block 1405 the method 1400 for means for implementing increased human perception of haptic feedback systems begins with manufacturing a wearable device, by the following operations:

At block 1410 the method includes fabricating a wearable device case.

At block 1415 the method includes positioning a plurality of actuators within an elastomer surrounding the sides of each of the plurality of actuators, the elastomer to hold the actuators in position, in which each of the plurality of actuators are to vibrate independently or in combination.

At block 1420 the method includes affixing the plurality of actuators within the elastomer within the wearable device case, in which one surface of each of the plurality of actuators remains exposed at a surface of the wearable device case.

At block 1425 the method includes electrically connecting each of the plurality of actuators to internal semiconductor components of the wearable device within the wearable device case.

Figure 15:
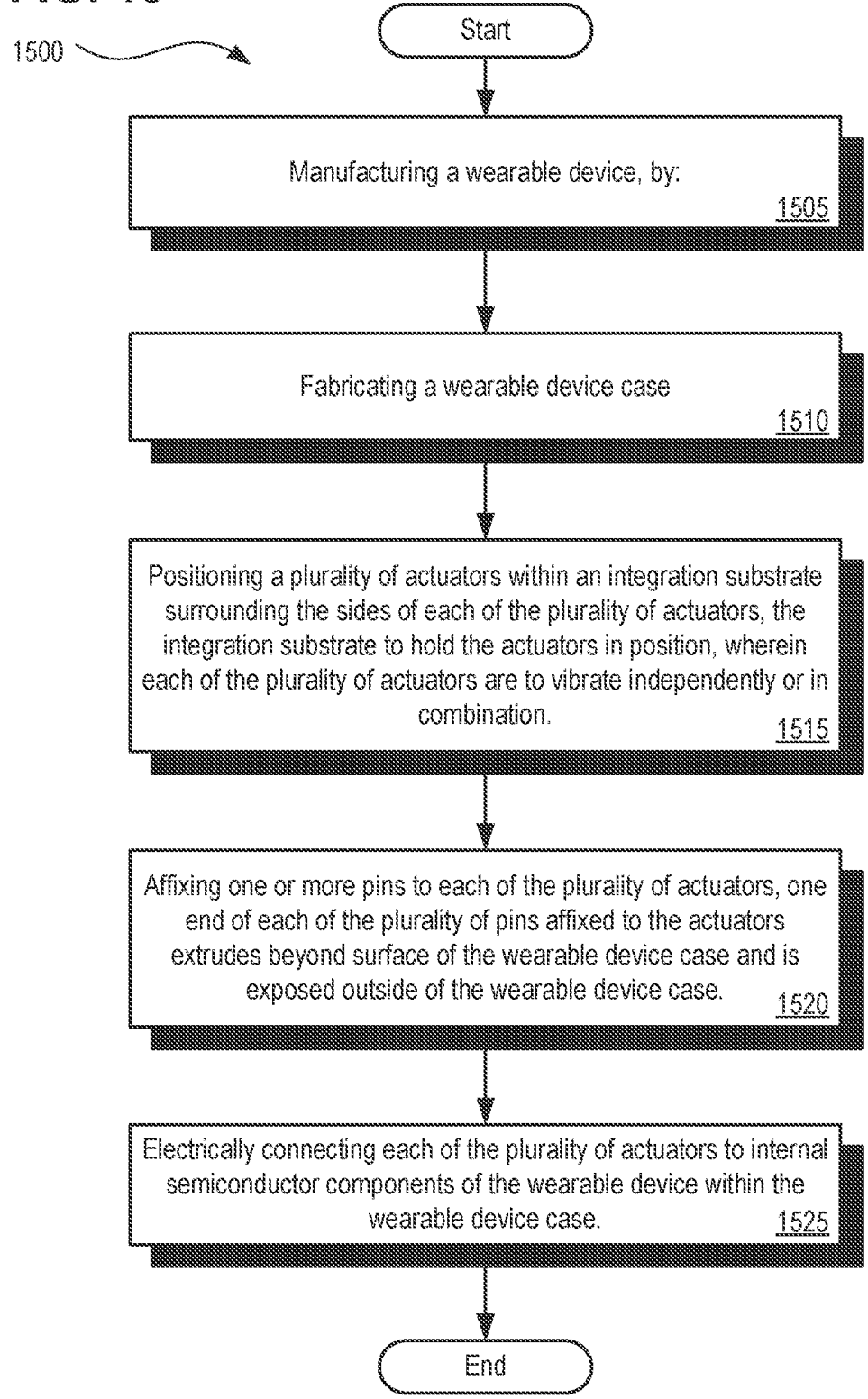

FIG. 15 is a flow diagram illustrating a method 1500 for means for implementing increased human perception of haptic feedback systems in accordance with described embodiments. Some of the blocks and/or operations listed below are optional in accordance with certain embodiments. The numbering of the blocks presented is for the sake of clarity and is not intended to prescribe an order of operations in which the various blocks must occur. Additionally, operations from flow 1500 may be utilized in a variety of combinations.

At block 1505 the method 1500 for means for implementing increased human perception of haptic feedback systems begins with manufacturing a wearable device, by the following operations:

At block 1510 the method includes fabricating a wearable device case.

At block 1515 the method includes positioning a plurality of actuators within an integration substrate surrounding the sides of each of the plurality of actuators, the integration substrate to hold the actuators in position, wherein each of the plurality of actuators are to vibrate independently or in combination.

At block 1520 the method includes affixing one or more pins to each of the plurality of actuators, one end of each of the plurality of pins affixed to the actuators extrudes beyond surface of the wearable device case and is exposed outside of the wearable device case.

At block 1525 the method includes electrically connecting each of the plurality of actuators to internal semiconductor components of the wearable device within the wearable device case.

While the subject matter disclosed herein has been described by way of example and in terms of the specific embodiments, it is to be understood that the claimed embodiments are not limited to the explicitly enumerated embodiments disclosed. To the contrary, the disclosure is intended to cover various modifications and similar arrangements as would be apparent to those skilled in the art. Therefore, the scope of the appended claims should be accorded the broadest interpretation so as to encompass all such modifications and similar arrangements. It is to be understood that the above description is intended to be illustrative, and not restrictive. Many other embodiments will be apparent to those of skill in the art upon reading and understanding the above description. The scope of the disclosed subject matter is therefore to be determined in reference to the appended claims, along with the full scope of equivalents to which such claims are entitled.

It is therefore in accordance with the described embodiments, that:

According to one embodiment there is a wearable device, including: a wearable device case; a plurality of actuators within the wearable device case, each of which to vibrate independently or in combination; in which one surface of each of the plurality of actuators is exposed at a surface of the wearable device case; an elastomer surrounding the sides of each of the plurality of actuators within the wearable device case to hold the actuators in position within the wearable device case; and electrical interconnects from each of the plurality of actuators to internal semiconductor components of the wearable device.

According to another embodiment the wearable device, further includes: contact pads between each of the plurality of actuators and the internal semiconductor components of the wearable device, in which the contact pads form the electrical interconnects from the actuators to the internal semiconductor components of the wearable device.

According to another embodiment the wearable device, further includes: flexible contact pins between each of the plurality of actuators and the internal semiconductor components of the wearable device, in which the flexible contact pins form the electrical interconnects from the actuators to the internal semiconductor components of the wearable device.

According to another embodiment of the wearable device, the flexible contact pins are formed from electrically conductive springs, and in which the electrically conductive springs provide both mechanical dampening within the wearable device case from vibrations emanating from each of the plurality of actuators and additionally electrically interface the plurality of actuators to the internal semiconductor components of the wearable device.

According to another embodiment of the wearable device, the elastomer surrounding the sides of each of the plurality of actuators within the wearable device case to hold the actuators in position within the wearable device case forms a soft substrate for the plurality of actuators within the wearable device case; and in which a portion of the soft substrate is at least partially evacuated between the plurality of actuators leaving the plurality of actuators within the device case physically encompassed on all sides within the elastomer and surrounded by one or more air gaps within the wearable device case where the elastomer has been at least partially evacuated.

According to another embodiment of the wearable device, the portion of the soft substrate having been at least partially evacuated includes the soft substrate being evacuated within the wearable device case by one or more processes including: an injection molding process to leave the one or more air gaps; a photolithographic patterning and chemical etching process to remove at least a portion of the elastomer to form the one or more air gaps; a mechanical removal process to remove at least a portion of the elastomer to form the one or more air gaps; and a thinning procedure to remove at least a portion of the elastomer to form the one or more air gaps.

According to another embodiment of the wearable device, the one surface of each of the plurality of actuators to be exposed at the surface of the wearable device case includes a human contact surface to make physical contact with skin of a human user wearing the wearable device.

According to another embodiment the wearable device, further includes: a semiconductor package having the internal semiconductor components of the wearable device embedded therein; and a substrate of the semiconductor package with electrical contacts to receive the electrical interconnects from each of the plurality of actuators to internal semiconductor components of the wearable device.

According to another embodiment of the wearable device, the semiconductor package includes one or more of: a CPU processor die; a logic die; a wireless transceiver functional semiconductor device providing wireless connectivity for the wearable device; a heat sink; a memory die; a System On a Chip functional semiconductor device; and a Platform Controller Hub (PCH) functional semiconductor device.

According to another embodiment of the wearable device, the elastomer surrounding the sides of each of the plurality of actuators includes part of a compliant and stretchable substrate for the wearable device and one or more electrically connected electrical components, sensors, functional modules or the internal semiconductor components of the wearable device.

According to another embodiment of the wearable device, the elastomer surrounding the sides of each of the plurality of actuators includes at least one of a soft elastomer formed from a polydimethylsiloxane (PDMS) substrate, a stretchable Polyisoprene substrate, a stretchable polybutadiene substrate, a stretchable polyisobutylene substrate, a stretchable polyurethanes substrate, a stretchable thermoplasticpolyurethanes substrate, a stretchable butyl rubber substrate, or a stretchable nitrile rubber substrate.

According to another embodiment of the wearable device, the elastomer surrounding the sides of each of the plurality of actuators includes part of a soft elastomer substrate for the wearable device; and in which the soft elastomer substrate includes one of: a flex circuit; a flexible plastic substrate; a stretchable electronic substrate; a stretchable dielectric material; a compliant, bendable, or flexible dielectric substrate; a polyimide substrate; a PolyEther Ether Ketone (PEEK) substrate; a PolyDiMethylSiloxane (PDMS) substrate; a Flexible Printed Circuit (FPC) substrate; a silicon-based organic polymer substrate; and a screen printed silver circuits on polyester substrate.

According to another embodiment of the wearable device, the plurality of actuators within the wearable device case form multiple haptic actuators and localized tactors within a haptic feedback system of the wearable device to generate localized and non-global haptic feedback signals perceptible to a human user.

According to another embodiment of the wearable device, the plurality of actuators include one of: electroactive polymer actuators; electromagnetic actuators; piezoelectric actuators; hybrid actuators; Eccentric Rotating Mass Motor (ERM) actuators; coin-cell form factor actuators; or Linear Resonant Actuators (LRAs).

According to another embodiment of the wearable device, the wearable device embodies one of: a clothing item; a tactile suit; a keyboard; a mouse; a stylus a smartphone; a tablet; wearable sports attire; a shoe; a watch; a smartwatch; a fitness band; a ring; a bracelet; a wearable technology to be worn as a clothing item or an accessory; fashion electronics to be worn as a clothing item or an accessory; tech togs to be worn as a clothing item or an accessory; fashionable technology to be worn as a clothing item or an accessory; or a flexible wearable technology to be worn as a clothing item or an accessory.

According to a particular embodiment there is a method of manufacturing a wearable device, in which the method includes: fabricating a wearable device case; positioning a plurality of actuators within an elastomer surrounding the sides of each of the plurality of actuators, the elastomer to hold the actuators in position; in which each of the plurality of actuators are to vibrate independently or in combination; affixing the plurality of actuators within the elastomer within the wearable device case, in which one surface of each of the plurality of actuators remains exposed at a surface of the wearable device case; and electrically connecting each of the plurality of actuators to internal semiconductor components of the wearable device within the wearable device case.

According to another embodiment of the method, positioning the plurality of actuators within the elastomer surrounding the sides of each of the plurality of actuators includes press-fitting each of the plurality of actuators into the elastomer.

According to another embodiment, the method further includes: embedding each of the plurality of actuators within an elastomeric gasket; and in which positioning the plurality of actuators within the elastomer surrounding the sides of each of the plurality of actuators includes press-fitting each of the plurality of actuators embedded within their respective elastomeric gaskets into the elastomer.

According to another embodiment of the method, the elastomeric gaskets are round elastomeric gaskets or non-round wave form shaped elastomeric gaskets; and in which the elastomeric gaskets provide mechanical dampening within the wearable device case from vibrations emanating from each of the plurality of actuators.

According to another embodiment of the method, positioning the plurality of actuators within the elastomer surrounding the sides of each of the plurality of actuators includes: applying adhesive tape to a carrier plate; temporarily affixing each of the plurality of actuators to the adhesive tape atop the carrier plate; molding the elastomer around the plurality of actuators while affixed to the adhesive tape atop the carrier plate; and separating the elastomer having the plurality of actuators positioned therein from the adhesive tape and carrier plate as elastomer and actuator assembly.

According to another embodiment of the method, in which positioning the plurality of actuators within the elastomer surrounding the sides of each of the plurality of actuators includes: gluing the plurality of actuators into the wearable device case; covering the wearable device case with a mold case; injection molding the elastomer into the mold case encompassing the plurality of actuators within the elastomer within the wearable device case; and removing the mold case.

According to another embodiment of the method, in which the wearable device further includes a semiconductor package having the internal semiconductor components of the wearable device embedded therein and a substrate of the semiconductor package with electrical contacts to receive the electrical interconnects from each of the plurality of actuators to internal semiconductor components of the wearable device; and in which the semiconductor package includes one or more of: a CPU processor die; a logic die; a wireless transceiver functional semiconductor device providing wireless connectivity for the wearable device; a heat sink; a memory die; a System On a Chip functional semiconductor device; and a Platform Controller Hub (PCH) functional semiconductor device.

According to a particular embodiment there is a wearable technology to be worn as a clothing item or an accessory, the wearable technology including: a wearable device case; a plurality of actuators within the wearable device case, each of which to vibrate independently or in combination; in which one surface of each of the plurality of actuators is exposed at a surface of the wearable device case; an elastomer surrounding the sides of each of the plurality of actuators within the wearable device case to hold the actuators in position within the wearable device case; and electrical interconnects from each of the plurality of actuators to internal semiconductor components of the wearable technology.

According to another embodiment of the wearable technology, the wearable technology is embodied within one of: a clothing item; a tactile suit; a keyboard; a mouse; a stylus a smartphone; a tablet; wearable sports attire; a shoe; a watch; a smartwatch; a fitness band; a ring; a bracelet; a wearable technology to be worn as a clothing item or an accessory; fashion electronics to be worn as a clothing item or an accessory; tech togs to be worn as a clothing item or an accessory; fashionable technology to be worn as a clothing item or an accessory; or a flexible wearable technology to be worn as a clothing item or an accessory.

According to another embodiment of the wearable technology, the wearable technology further includes a semiconductor package having the internal semiconductor components of the wearable technology embedded therein and a substrate of the semiconductor package with electrical contacts to receive the electrical interconnects from each of the plurality of actuators to internal semiconductor components of the wearable technology; and in which the semiconductor package includes one or more of: a CPU processor die; a logic die; a wireless transceiver functional semiconductor device providing wireless connectivity for the wearable technology; a heat sink; a memory die; a System On a Chip functional semiconductor device; and a Platform Controller Hub (PCH) functional semiconductor device.

According to another embodiment there is a wearable device, including: a wearable device case; a plurality of actuators within the wearable device case, each of which to vibrate independently or in combination; one or more pins attached to each of the plurality of actuators, one end of each of the plurality of pins affixed to the actuators extrudes beyond surface of the wearable device case and is exposed outside of the wearable device case; electrical interconnects from each of the plurality of actuators to internal semiconductor components of the wearable device.

According to another embodiment of the wearable device, the one end of each of the plurality of pins affixed to the actuators includes a human contact surface to make physical contact with skin of a human user wearing the wearable device.

According to another embodiment of the wearable device, each of the one or more pins attached to the plurality of actuators are permanently affixed to a surface of one of the actuators via one of: an epoxy; solder paste; an epoxy solder; or a glue.

According to another embodiment of the wearable device, each of the one or more pins attached to the plurality of actuators are permanently affixed to a surface of one of the actuators by: applying solder paste to the surface of the plurality of actuators; positioning the pins in the solder paste atop the plurality of actuators; and re-flowing the wearable device to permanently solder the pins to the actuators.

According to another embodiment of the wearable device, each of the one or more pins attached to the plurality of actuators are permanently affixed to a surface of one of the actuators by: screen printing epoxy or solder paste to the surface of the plurality of actuators; positioning the pins in the solder paste atop the plurality of actuators; and curing or re-flowing the wearable device to permanently affix the pins to the actuators.

According to another embodiment of the wearable device, each of the one or more pins attached to the plurality of actuators are permanently affixed to a surface of one of the actuators by: depositing epoxy atop the plurality of actuators; and thermally curing, UV curing, and/or air curing the epoxy to permanently affix the pins to the actuators.

According to another embodiment of the wearable device, each of the one or more pins attached to the plurality of actuators are permanently affixed to a surface of one of the actuators by: depositing an epoxy or glue atop the plurality of actuators via an automated dispenser; and positioning the pins in the epoxy or glue atop the plurality of actuators via an automated pick and place component handler; and curing the epoxy or glue.

According to another embodiment of the wearable device, each of the one or more pins attached to the plurality of actuators includes multiple pins positioned toward an outer perimeter of the wearable device nearest an outside edge of each actuator in closest proximity with the outer perimeter of the wearable device.

According to another embodiment of the wearable device, each of the one or more pins attached to the plurality of actuators includes multiple pins positioned atop each of the plurality of actuators in a position which maximizes their pitch distance from a remaining plurality of pins affixed to other actuators within the wearable device.

According to another embodiment of the wearable device, each of the one or more pins attached to the plurality of actuators includes one pin center-positioned atop each of the plurality of actuators.

According to another embodiment of the wearable device, each of the one or more pins attached to the plurality of actuators includes pins having a cylindrical shape with a flat end affixed to the actuators and a rounded shape end extruding beyond the surface of the wearable device case, in which the rounded shape end to make physical contact with skin of a human user.

According to another embodiment of the wearable device, each of the one or more pins attached to the plurality of actuators includes pins having a conical shape with a first flat end having a widest diameter base affixed to the actuators and a second flat end having a narrowest diameter base extruding beyond the surface of the wearable device case, in which the second flat end is to make physical contact with skin of a human user.

According to another embodiment, the wearable device further includes an integration substrate surrounding the sides of each of the plurality of actuators within the wearable device case to hold the actuators in position within the wearable device case.

According to another embodiment of the wearable device, the integration substrate includes a soft elastomer to provide mechanical dampening within the wearable device case from vibrations emanating from each of the plurality of actuators.

According to another embodiment of the wearable device, an elastomer surrounds the sides of each of the plurality of actuators within the wearable device case to hold the actuators in position within the wearable device case forming a soft substrate for the plurality of actuators within the wearable device case; and in which a portion of the soft substrate is at least partially evacuated between the plurality of actuators leaving the plurality of actuators within the device case physically encompassed on all sides within the elastomer and surrounded by one or more air gaps within the wearable device case where the elastomer has been at least partially evacuated.

According to another embodiment, the wearable device further includes contact pads between each of the plurality of actuators and the internal semiconductor components of the wearable device, in which the contact pads form the electrical interconnects from the actuators to the internal semiconductor components of the wearable device.

According to another embodiment, the wearable device further includes flexible contact pins between each of the plurality of actuators and the internal semiconductor components of the wearable device, in which the flexible contact pins form the electrical interconnects from the actuators to the internal semiconductor components of the wearable device; and in which the flexible contact pins are formed from electrically conductive springs, and in which the electrically conductive springs provide both mechanical dampening within the wearable device case from vibrations emanating from each of the plurality of actuators and additionally electrically interface the plurality of actuators to the internal semiconductor components of the wearable device.

According to another embodiment, the wearable device further includes a semiconductor package having the internal semiconductor components of the wearable device embedded therein; a substrate of the semiconductor package with electrical contacts to receive the electrical interconnects from each of the plurality of actuators to internal semiconductor components of the wearable device; and in which the semiconductor package includes one or more of: a CPU processor die; a logic die; a wireless transceiver functional semiconductor device providing wireless connectivity for the wearable device; a heat sink; a memory die; a System On a Chip functional semiconductor device; and a Platform Controller Hub (PCH) functional semiconductor device.

According to another embodiment of the wearable device, the plurality of actuators within the wearable device case form multiple haptic actuators and localized tactors within a haptic feedback system of the wearable device to generate localized and non-global haptic feedback signals perceptible to a human user. According to another embodiment of the wearable device, the plurality of actuators include one of: electroactive polymer actuators; electromagnetic actuators; piezoelectric actuators; hybrid actuators; Eccentric Rotating Mass Motor (ERM) actuators; coin-cell form factor actuators; or Linear Resonant Actuators (LRAs).

According to another embodiment of the wearable device, the wearable device embodies one of: a clothing item; a tactile suit; a keyboard; a mouse; a stylus a smartphone; a tablet; wearable sports attire; a shoe; a watch; a smartwatch; a fitness band; a ring; a bracelet; a wearable technology to be worn as a clothing item or an accessory; fashion electronics to be worn as a clothing item or an accessory; tech togs to be worn as a clothing item or an accessory; fashionable technology to be worn as a clothing item or an accessory; or a flexible wearable technology to be worn as a clothing item or an accessory.

According to another embodiment there is a method of manufacturing a wearable device, the method including: fabricating a wearable device case; positioning a plurality of actuators within an integration substrate surrounding the sides of each of the plurality of actuators, the integration substrate to hold the actuators in position; in which each of the plurality of actuators are to vibrate independently or in combination; affixing one or more pins to each of the plurality of actuators, one end of each of the plurality of pins affixed to the actuators extrudes beyond surface of the wearable device case and is exposed outside of the wearable device case; and electrically connecting each of the plurality of actuators to internal semiconductor components of the wearable device within the wearable device case.

According to another embodiment of the method, affixing each of the one or more pins attached to the plurality of actuators includes permanently affixing the pins to a surface of one of the actuators by: applying solder paste to the surface of the plurality of actuators; positioning the pins in the solder paste atop the plurality of actuators; and re-flowing the wearable device to permanently solder the pins to the actuators.

According to another embodiment of the method, each of the one or more pins attached to the plurality of actuators are permanently affixed to a surface of one of the actuators by: screen printing epoxy or solder paste to the surface of the plurality of actuators; positioning the pins in the solder paste atop the plurality of actuators; and curing or re-flowing the wearable device to permanently affix the pins to the actuators.

According to another embodiment there is a wearable technology to be worn as a clothing item or an accessory, the wearable technology including: a wearable device case; a plurality of actuators within the wearable device case, each of which to vibrate independently or in combination; one or more pins attached to each of the plurality of actuators, one end of each of the plurality of pins affixed to the actuators extrudes beyond surface of the wearable device case and is exposed outside of the wearable device case; electrical interconnects from each of the plurality of actuators to internal semiconductor components of the wearable device.

According to another embodiment of the wearable technology, the wearable technology is embodied within one of: a clothing item; a tactile suit; a keyboard; a mouse; a stylus a smartphone; a tablet; wearable sports attire; a shoe; a watch; a smartwatch; a fitness band; a ring; a bracelet; a wearable technology to be worn as a clothing item or an accessory; fashion electronics to be worn as a clothing item or an accessory; tech togs to be worn as a clothing item or an accessory; fashionable technology to be worn as a clothing item or an accessory; or a flexible wearable technology to be worn as a clothing item or an accessory.

According to another embodiment of the wearable technology, the wearable technology further includes a semiconductor package having the internal semiconductor components of the wearable technology embedded therein and a substrate of the semiconductor package with electrical contacts to receive the electrical interconnects from each of the plurality of actuators to internal semiconductor components of the wearable technology; and in which the semiconductor package includes one or more of: a CPU processor die; a logic die; a wireless transceiver functional semiconductor device providing wireless connectivity for the wearable technology; a heat sink; a memory die; a System On a Chip functional semiconductor device; and a Platform Controller Hub (PCH) functional semiconductor device.

What is claimed is:

1. A wearable device, comprising:
a wearable device case;
a plurality of actuators within the wearable device case, each of which to vibrate independently or in combination;
one or more pins attached to each of the plurality of actuators, one end of each of the plurality of pins affixed to the actuators extrudes beyond a surface of the wearable device case and is exposed outside of the wearable device case, the one or more pins offset from a central axis of a corresponding one of the plurality of actuators; and
electrical interconnects from each of the plurality of actuators to internal semiconductor components of the wearable device.

2. The wearable device of claim 1, wherein the one end of each of the plurality of pins affixed to the actuators comprises a human contact surface to make physical contact with skin of a human user wearing the wearable device.

3. The wearable device of claim 1, wherein each of the one or more pins attached to the plurality of actuators are permanently affixed to a surface of one of the actuators via one of:
an epoxy;
solder paste;
an epoxy solder; or
a glue.

4. The wearable device of claim 1, wherein each of the one or more pins attached to the plurality of actuators are permanently affixed to a surface of one of the actuators by:
applying solder paste to the surface of the plurality of actuators;
positioning the pins in the solder paste atop the plurality of actuators; and
re-flowing the wearable device to permanently solder the pins to the actuators.

5. The wearable device of claim 1, wherein each of the one or more pins attached to the plurality of actuators are permanently affixed to a surface of one of the actuators by:
screen printing epoxy or solder paste to the surface of the plurality of actuators;
positioning the pins in the solder paste atop the plurality of actuators; and
curing or re-flowing the wearable device to permanently affix the pins to the actuators.

6. The wearable device of claim 1, wherein each of the one or more pins attached to the plurality of actuators are permanently affixed to a surface of one of the actuators by:
depositing epoxy atop the plurality of actuators; and
thermally curing, UV curing, and/or air curing the epoxy to permanently affix the pins to the actuators.

7. The wearable device of claim 1, wherein each of the one or more pins attached to the plurality of actuators are permanently affixed to a surface of one of the actuators by:
depositing an epoxy or glue atop the plurality of actuators via an automated dispenser; and
positioning the pins in the epoxy or glue atop the plurality of actuators via an automated pick and place component handler; and
curing the epoxy or glue.

8. The wearable device of claim 1, wherein each of the one or more pins attached to the plurality of actuators comprises multiple pins positioned toward an outer perimeter of the wearable device nearest an outside edge of each actuator in closest proximity with the outer perimeter of the wearable device.

9. The wearable device of claim 1, wherein each of the one or more pins attached to the plurality of actuators comprises multiple pins positioned atop each of the plurality of actuators in a position which maximizes their pitch distance from a remaining plurality of pins affixed to other actuators within the wearable device.

10. The wearable device of claim 1, wherein each of the one or more pins attached to the plurality of actuators comprises pins having a cylindrical shape with a flat end affixed to the actuators and a rounded shape end extruding beyond the surface of the wearable device case, wherein the rounded shape end to make physical contact with skin of a human user.

11. The wearable device of claim 1, wherein each of the one or more pins attached to the plurality of actuators comprises pins having a conical shape with a first flat end having a widest diameter base affixed to the actuators and a second flat end having a narrowest diameter base extruding beyond the surface of the wearable device case, wherein the second flat end is to make physical contact with skin of a human user.

12. The wearable device of claim 1, further comprising:
an integration substrate surrounding the sides of each of the plurality of actuators within the wearable device case to hold the actuators in position within the wearable device case.

13. The wearable device of claim 12, wherein the integration substrate comprises a soft elastomer to provide mechanical dampening within the wearable device case from vibrations emanating from each of the plurality of actuators.

14. The wearable device of claim 1:
wherein an elastomer surrounds the sides of each of the plurality of actuators within the wearable device case to hold the actuators in position within the wearable device case forming a soft substrate for the plurality of actuators within the wearable device case; and
wherein a portion of the soft substrate is at least partially evacuated between the plurality of actuators leaving the plurality of actuators within the device case physically encompassed on all sides within the elastomer and surrounded by one or more air gaps within the wearable device case where the elastomer has been at least partially evacuated.

15. The wearable device of claim 1, further comprising:
flexible contact pins between each of the plurality of actuators and the internal semiconductor components of the wearable device, wherein the flexible contact pins form the electrical interconnects from the actuators to the internal semiconductor components of the wearable device; and
wherein the flexible contact pins are formed from electrically conductive springs, and wherein the electrically conductive springs provide both mechanical dampening within the wearable device case from vibrations emanating from each of the plurality of actuators and additionally electrically interface the plurality of actuators to the internal semiconductor components of the wearable device.

16. The wearable device of claim 1, further comprising:
a semiconductor package having the internal semiconductor components of the wearable device embedded therein;
a substrate of the semiconductor package with electrical contacts to receive the electrical interconnects from each of the plurality of actuators to internal semiconductor components of the wearable device; and
wherein the semiconductor package comprises one or more of:
a CPU processor die;
a logic die;
a wireless transceiver functional semiconductor device providing wireless connectivity for the wearable device;
a heat sink;
a memory die;
a System On a Chip functional semiconductor device; and
a Platform Controller Hub (PCH) functional semiconductor device.

17. The wearable device of claim 1, wherein the plurality of actuators within the wearable device case form multiple haptic actuators and localized tactors within a haptic feedback system of the wearable device to generate localized and non-global haptic feedback signals perceptible to a human user.

18. The wearable device of claim 1, wherein the plurality of actuators comprise one of:
electroactive polymer actuators;
electromagnetic actuators;
piezoelectric actuators;
hybrid actuators;
Eccentric Rotating Mass Motor (ERM) actuators;
coin-cell form factor actuators; or
Linear Resonant Actuators (LRAs).

19. A method of manufacturing a wearable device, the method comprising:
fabricating a wearable device case;
positioning a plurality of actuators within an integration substrate surrounding the sides of each of the plurality of actuators, the integration substrate to hold the actuators in position;
wherein each of the plurality of actuators are to vibrate independently or in combination;
affixing one or more pins to each of the plurality of actuators, one end of each of the plurality of pins affixed to the actuators extrudes beyond a surface of the wearable device case and is exposed outside of the wearable device case, the one or more pins offset from a central axis of a corresponding one of the plurality of actuators; and
electrically connecting each of the plurality of actuators to internal semiconductor components of the wearable device within the wearable device case.

20. The method of claim 19, wherein affixing each of the one or more pins attached to the plurality of actuators comprises permanently affixing the pins to a surface of one of the actuators by:
applying solder paste to the surface of the plurality of actuators;
positioning the pins in the solder paste atop the plurality of actuators; and
re-flowing the wearable device to permanently solder the pins to the actuators.

21. The method of claim 19, wherein each of the one or more pins attached to the plurality of actuators are permanently affixed to a surface of one of the actuators by:
screen printing epoxy or solder paste to the surface of the plurality of actuators;
positioning the pins in the solder paste atop the plurality of actuators; and
curing or re-flowing the wearable device to permanently affix the pins to the actuators.

22. A wearable technology to be worn as a clothing item or an accessory, the wearable technology comprising:
a wearable device case;
a plurality of actuators within the wearable device case, each of which to vibrate independently or in combination;
one or more pins attached to each of the plurality of actuators, one end of each of the plurality of pins affixed to the actuators extrudes beyond a surface of the wearable device case and is exposed outside of the wearable device case, the one or more pins offset from a central axis of a corresponding one of the plurality of actuators;
electrical interconnects from each of the plurality of actuators to internal semiconductor components of the wearable device.

23. The wearable technology of claim 22, wherein the wearable technology is embodied within one of:
a clothing item;
a tactile suit;

a keyboard;
a mouse;
a stylus
a smartphone;
a tablet;
wearable sports attire;
a shoe;
a watch;
a smartwatch;
a fitness band;
a ring;
a bracelet;
a wearable technology to be worn as a clothing item or an accessory;
fashion electronics to be worn as a clothing item or an accessory;
tech togs to be worn as a clothing item or an accessory;
fashionable technology to be worn as a clothing item or an accessory; or
a flexible wearable technology to be worn as a clothing item or an accessory.

24. The wearable technology of claim 22, wherein:
wherein the wearable technology further comprises a semiconductor package having the internal semiconductor components of the wearable technology embedded therein and a substrate of the semiconductor package with electrical contacts to receive the electrical interconnects from each of the plurality of actuators to internal semiconductor components of the wearable technology; and
wherein the semiconductor package comprises one or more of:
a CPU processor die;
a logic die;
a wireless transceiver functional semiconductor device providing wireless connectivity for the wearable technology;
a heat sink;
a memory die;
a System On a Chip functional semiconductor device; and
a Platform Controller Hub (PCH) functional semiconductor device.

25. A wearable device, comprising:
a wearable device case;
a plurality of actuators within the wearable device case, each of which to vibrate independently or in combination;
one or more pins attached to each of the plurality of actuators, one end of each of the plurality of pins affixed to the actuators extrudes beyond a surface of the wearable device case and is exposed outside of the wearable device case; and
electrical interconnects from each of the plurality of actuators to internal semiconductor components of the wearable device, wherein each of the one or more pins attached to the plurality of actuators are permanently affixed to a surface of one of the actuators by:
depositing an epoxy or glue atop the plurality of actuators via an automated dispenser; and
positioning the pins in the epoxy or glue atop the plurality of actuators via an automated pick and place component handler; and
curing the epoxy or glue.

26. A wearable device, comprising:
a wearable device case;
a plurality of actuators within the wearable device case, each of which to vibrate independently or in combination;
one or more pins attached to each of the plurality of actuators, one end of each of the plurality of pins affixed to the actuators extrudes beyond a surface of the wearable device case and is exposed outside of the wearable device case, wherein each of the one or more pins attached to the plurality of actuators comprises multiple pins positioned atop each of the plurality of actuators in a position which maximizes their pitch distance from a remaining plurality of pins affixed to other actuators within the wearable device; and
electrical interconnects from each of the plurality of actuators to internal semiconductor components of the wearable device.

* * * * *